(12) United States Patent
Boo et al.

(10) Patent No.: US 7,223,158 B2
(45) Date of Patent: May 29, 2007

(54) METHOD FOR POLISHING A SEMICONDUCTOR WAFER

(75) Inventors: Jae-Phil Boo, Suwon (KR); Jun-Gyu Ryu, Seoul (KR); Sang-Seon Lee, Yongin-shi (KR); Sun-Wung Lee, Yongin-shi (KR)

(73) Assignee: Samsung Electronics Co., Ltd. (KR)

( * ) Notice: Subject to any disclaimer, the term of this patent is extended or adjusted under 35 U.S.C. 154(b) by 87 days.

(21) Appl. No.: 11/326,555

(22) Filed: Jan. 5, 2006

(65) Prior Publication Data

US 2006/0116056 A1 Jun. 1, 2006

Related U.S. Application Data

(62) Division of application No. 11/052,275, filed on Feb. 7, 2005, now Pat. No. 7,081,045, which is a division of application No. 10/670,855, filed on Sep. 25, 2003, now Pat. No. 6,921,323, which is a division of application No. 09/877,922, filed on Jun. 7, 2001, now Pat. No. 6,652,362.

(30) Foreign Application Priority Data

Nov. 23, 2000 (KR) .................................. 00-69983
Mar. 3, 2001 (KR) .................................. 01-11055

(51) Int. Cl.
*B24B 49/00* (2006.01)
(52) U.S. Cl. .................. 451/41; 451/285; 451/289; 451/398
(58) Field of Classification Search .............. 451/8, 451/9, 41, 285–290, 385, 388, 397, 398; 279/9; 340/680
See application file for complete search history.

(56) References Cited

U.S. PATENT DOCUMENTS 5,851,140 A 12/1998 Barns et al.
5,916,015 A 6/1999 Natalicio (Continued)

*Primary Examiner*—Lee D. Wilson
*Assistant Examiner*—Anthony Ojini
(74) *Attorney, Agent, or Firm*—Mills & Onello LLP

(57) ABSTRACT

An apparatus for polishing a wafer comprises a supporting portion having an abrasive pad disposed thereon, and a polishing head disposed over the abrasive pad. The polishing head comprises a carrier having at least two fluid passages, a retainer ring disposed on a lower edge of the carrier, forming a space for receiving the wafer, a supporter disposed in the carrier, and a flexible membrane disposed to be in contact with the wafer. The supporter has an upper surface portion, a lower surface portion, a plurality of first holes, a plurality of second holes, and a first chamber. The upper surface portion of the supporter forms a second chamber along with an inner surface of the carrier. The second chamber is in communication with one of the two fluid passages of the carrier and the second holes are formed in a lower surface portion of the supporter to communicate with the second chamber. The first chamber is in communication with the other one of the two fluid passages and the first holes are formed in the lower surface portion of the supporter to communicate with the first chamber. The lower surface portion of the supporter has a flat surface and a chamfered or rounded edge. The membrane disposed to enclose the lower surface portion of the supporter has a plurality of third holes formed at positions corresponding to the first holes to absorb and hold the wafer by vacuum.

10 Claims, 18 Drawing Sheets

U.S. PATENT DOCUMENTS

| | | | |
|---|---|---|---|
| 5,957,751 A * | 9/1999 | Govzman et al. | 451/8 |
| 6,033,292 A | 3/2000 | Inaba | |
| 6,036,587 A * | 3/2000 | Tolles et al. | 451/288 |
| 6,050,882 A | 4/2000 | Chen | |
| 6,273,803 B1 | 8/2001 | Wang et al. | |
| 6,273,804 B1 | 8/2001 | Numoto | |
| 6,277,000 B1 | 8/2001 | Gotcher | |
| 6,277,014 B1 * | 8/2001 | Chen et al. | 451/398 |
| 6,361,420 B1 | 3/2002 | Zuniga et al. | |
| 6,447,379 B1 | 9/2002 | Gromko et al. | |
| 6,824,456 B2 * | 11/2004 | Ebner et al. | 451/287 |

* cited by examiner

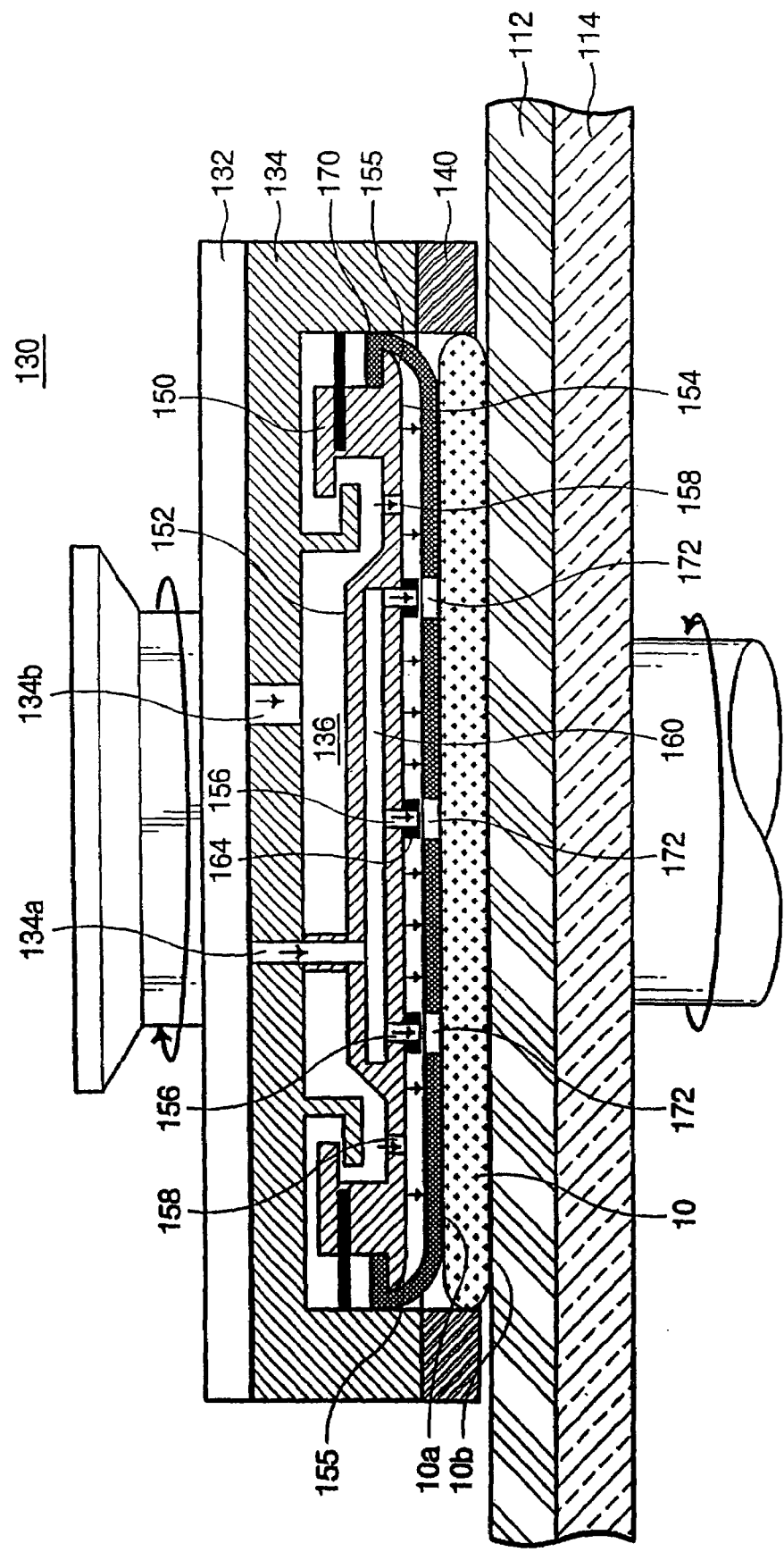

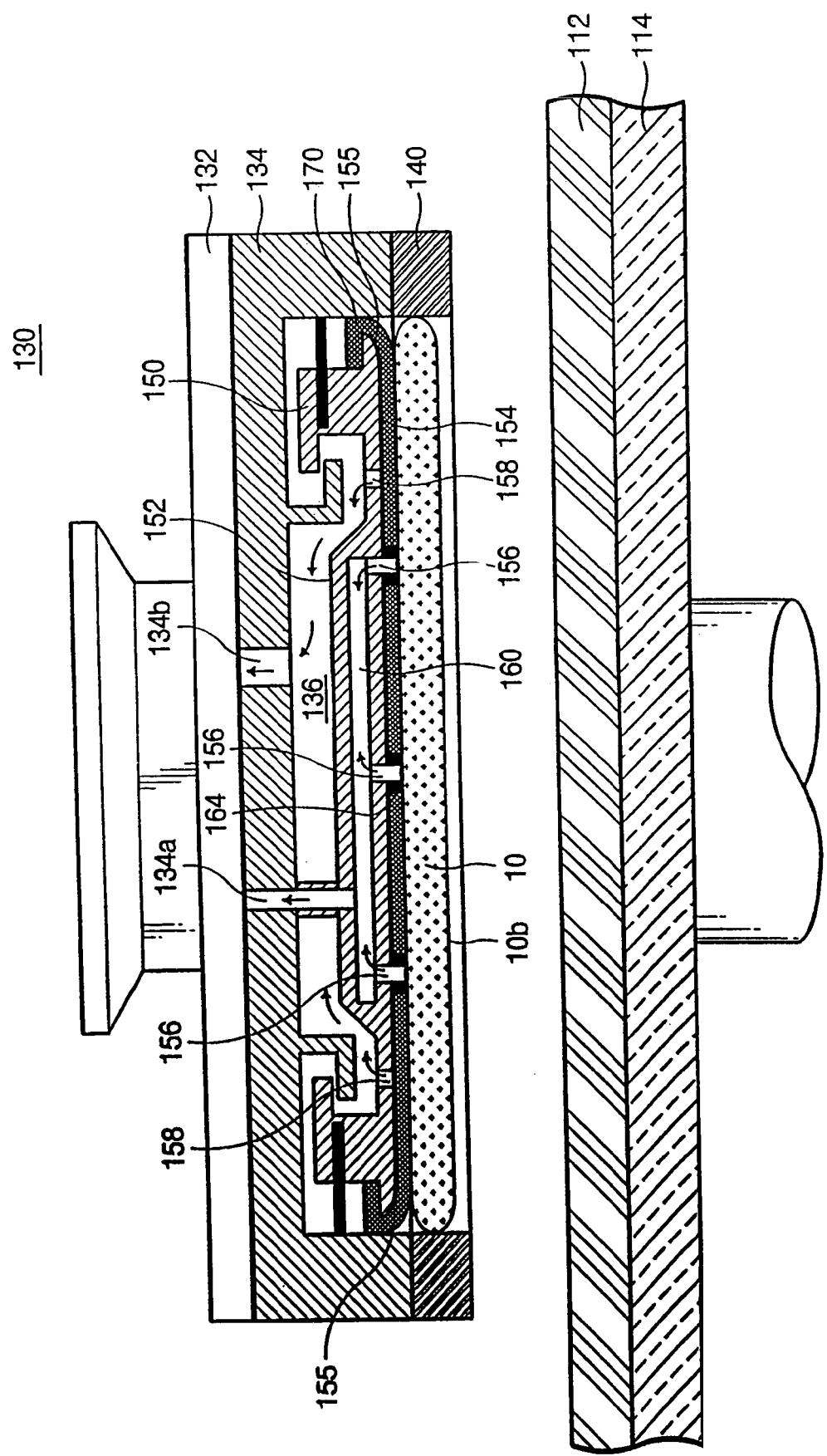

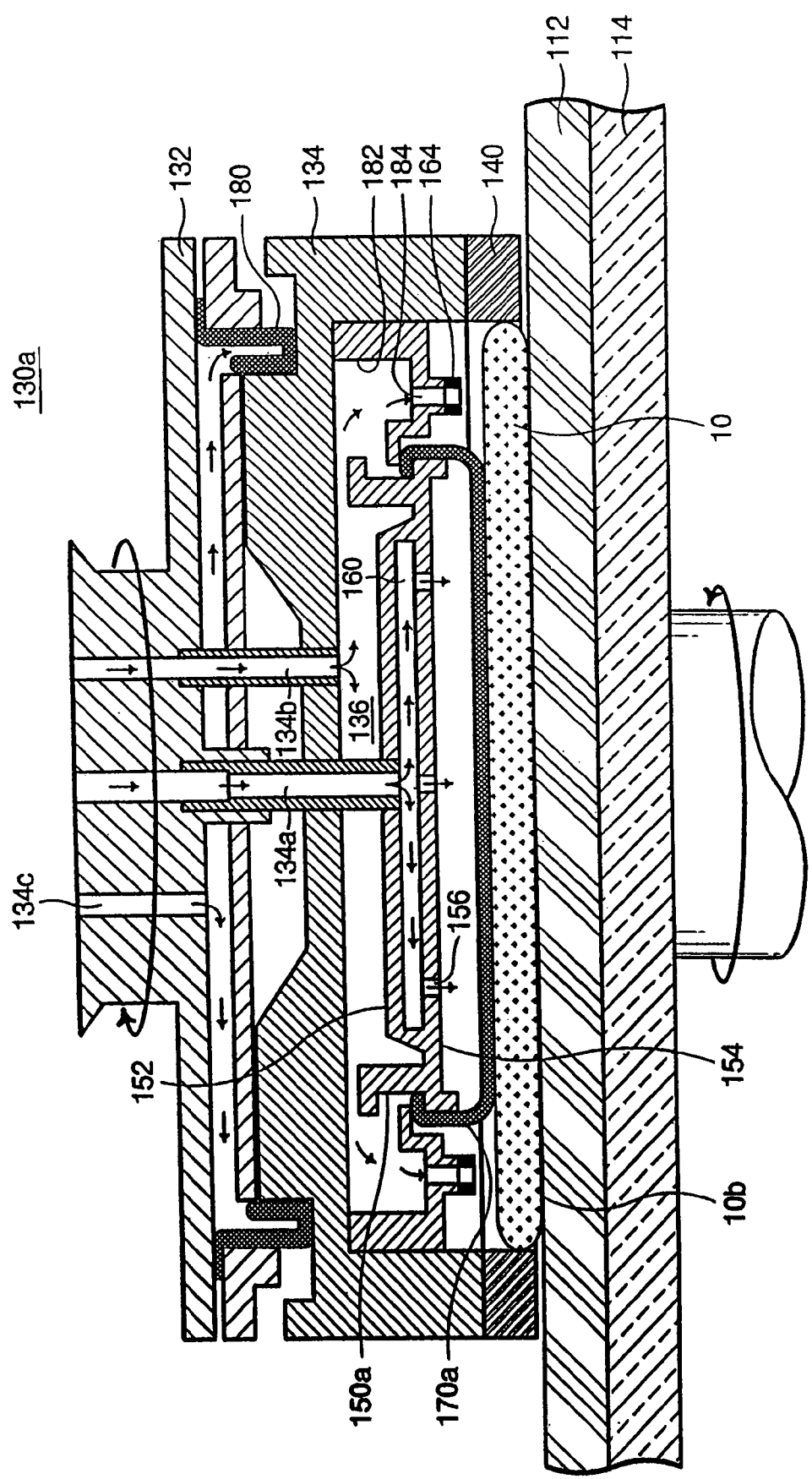

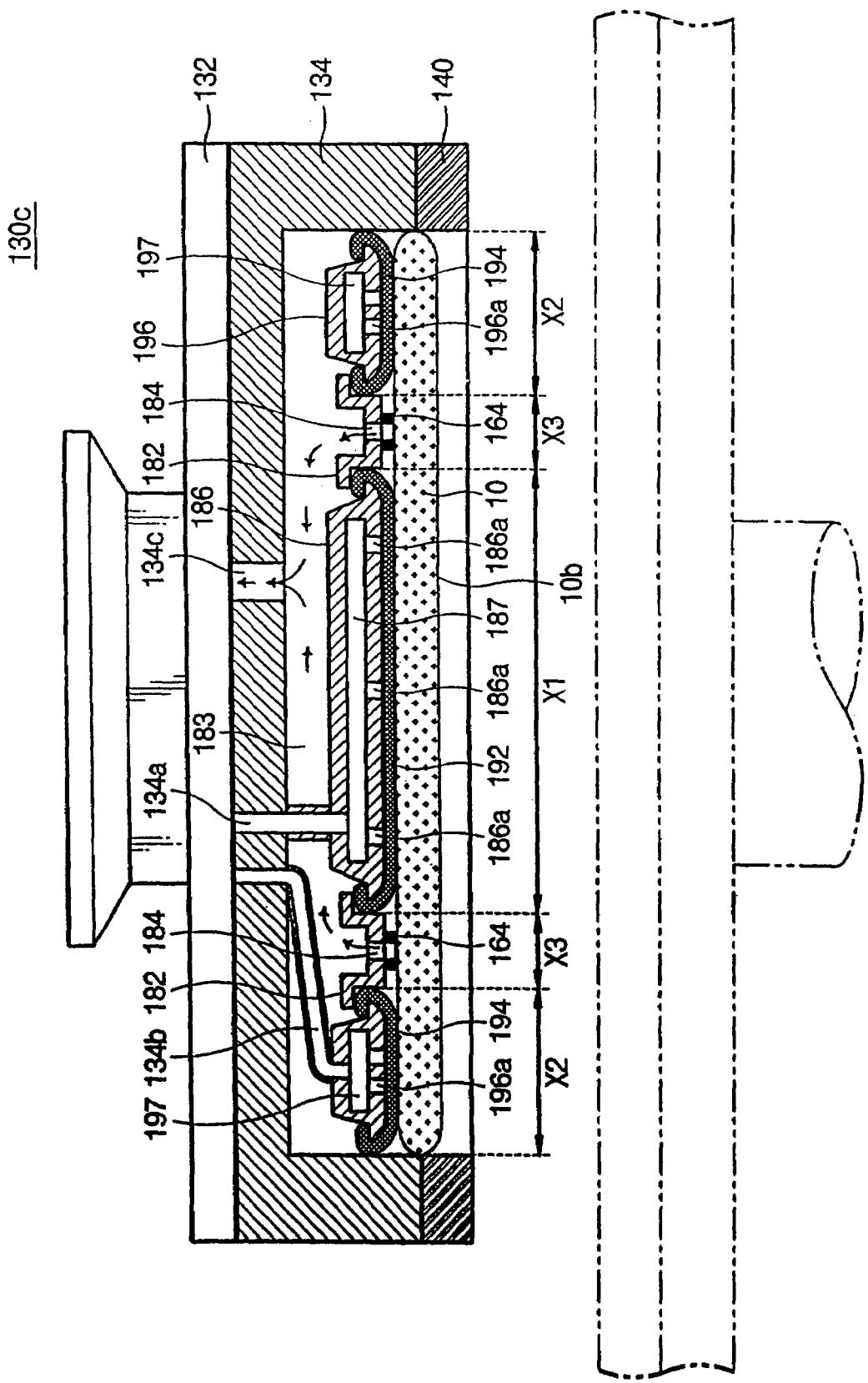

METHOD FOR POLISHING A SEMICONDUCTOR WAFER

RELATED APPLICATIONS

This application is a divisional application of U.S. application Ser. No. 11/052,275, filed Feb. 7, 2005, now U.S. Pat. No. 7,081,045, which is a divisional of U.S. application Ser. No. 10/670,855, filed Sep. 25, 2003, now U.S. Pat. No. 6,921,323, which is a divisional application of Ser. No. 09/877,922, filed Jun. 7, 2001, now U.S. Pat. No. 6,652,362, which relies for priority upon Korean Patent Application No. 2000-69983, filed on Nov. 23, 2000 and Korean Patent Application No. 2001-11055, filed on Mar. 3, 2001, the contents of which are herein incorporated by reference in their entirety.

FIELD OF THE INVENTION

The present invention relates to an apparatus for manufacturing a semiconductor wafer and method therefor, and more particularly to an apparatus for polishing a semiconductor wafer and method therefor.

BACKGROUND OF THE INVENTION

As the elements incorporated into a semiconductor device are increasingly integrated, the structure of device wires such as gate lines and bit lines continues to become multiple-layered. For this reason, step coverage between unit cells on a semiconductor substrate is increased. To reduce the step coverage between the unit cells, various methods of polishing a wafer have been developed. Among these methods, a chemical-mechanical polishing (CMP) method which planarizes the surface of the wafer in the fabrication is widely used.

In a general CMP process, a polishing head of a CMP apparatus secures a wafer using a vacuum or surface tension and loads the wafer on an abrasive pad of a turntable. The polishing head imposes a controllable load on the wafer to hold it in tight contact with the abrasive pad. Thereafter, the polishing head is rotated to rotate the wafer with respect to the abrasive pad of the turntable.

In order to increase the efficiency of the CMP process, the wafer should be polished at a high speed while maintaining uniform flatness. However, characteristics such as uniformity, flatness and polishing speed of the wafer are highly dependent on relative speed between the wafer and the abrasive pad, as well as the force or load of the polishing head urging the wafer against the abrasive pad. Particularly, the larger the force imposed on the wafer by the polishing head against the abrasive pad, the faster the polishing speed. Accordingly, in the case where an uneven load is imposed on the wafer by means of the polishing head, a portion of the wafer on which relatively large force is imposed will be polished at a faster rate than other portions of the wafer on which relatively small force is imposed.

Generally, the polishing head includes a flexible membrane which is adapted to pick up and release the by vacuum. However, the vacuum between the membrane and the wafer is often leaked, such that during transfer, the wafer may be dropped or otherwise harmed.

To address these limitations, a polishing head with a modified structure has been proposed, which chucks/releases a wafer via vacuum holes formed at bosses that protrude from a chucking supporter of the head. However, such a polishing head introduces limitations that are shown in FIG. 1, which is a graph illustrating the resulting uneven surface of a wafer. In FIG. 1, reference character A indicates a wafer portion corresponding to the protruded bosses and reference character B indicates a wafer corresponding to a step projected from an edge of the supporter. Portions A and B are relatively over-polished as compared to other portion of the wafer, thereby compromising the uniformity of polishing surface of the wafer.

SUMMARY OF THE INVENTION

It is an object of the present invention to provide an improved apparatus for polishing a semiconductor wafer and method therefor which can provide high polishing uniformity.

It is another object of the present invention to provide an improved apparatus for polishing a semiconductor wafer and method therefor which can individually control pressure to be imposed on each of certain areas of the wafer in a polishing process.

It is other object of the present invention to provide an improved apparatus for polishing a semiconductor wafer and method therefor which can individually control polishing speed of each of certain areas of the wafer in a polishing process.

It is further object of the present invention to provide an improved apparatus for polishing a semiconductor wafer and method therefor, having a polishing head which can stably pick up the wafer.

It is still other object of the present invention to provide an improved apparatus for polishing a semiconductor wafer and method therefor, which can prevent scratches from being generated by the polishing head due to cleansing slurry particles flowing between membranes and supporters during the polishing process.

These and other objects are provided, according to the present invention, by an apparatus for polishing a semiconductor wafer comprising a supporting portion having an abrasive pad disposed thereon, and a polishing head disposed over the abrasive pad. The polishing head comprises a dish shaped carrier, a retainer ring disposed on a lower edge of the carrier, a supporter disposed in the carrier to provide first and second chambers separated from each other, and a membrane enclosing a surface portion of the supporter to be able to be expanded and spaced apart from the surface portion.

In a preferred embodiment, the surface portion of the supporter has a flat surface and a plurality of first and second holes formed therein to communicate with the first and second chambers. The membrane has a plurality of third holes corresponding to the first holes.

Films are adhered on the flat surface around the first holes. Each of the films is sized so as to be inserted into the corresponding third hole and thickness less than, or equal to, that of the membrane. Also, an edge of the surface portion of the supporter can be chamfered or rounded.

In the embodiment, one of the second holes is formed in a center portion of said supporter, and there is no hole formed in a portion of the membrane corresponding to the one second hole.

According to another aspect of the present invention, there is provided an apparatus for polishing a wafer including a polishing head comprising: a carrier, a retainer ring disposed on a lower edge of the carrier, a supporter disposed in the carrier to provide a first chamber, a membrane enclosing a surface portion of the supporter to be able to be expanded and spaced apart from the surface portion, and a chucking ring for taking the wafer up by vacuum disposed on a lower portion the carrier to provide a second chamber.

In a preferred embodiment, the supporter has a plurality of first holes formed in a surface portion thereof to communicate with the first chamber, and the chucking ring has a plurality of second holes formed therein to communicate with the second chamber. Films are adhered on the chucking ring around the second holes to act as a medium in taking up or taking up and releasing of the wafer. The first and second chambers can have first and second fluid passages communicating external to the polishing head.

In the embodiment, the polishing head further includes a manifold for supplying air or fluid, or vacuum, from the outside of the polishing head to the first and second fluid passages, and a first elastic member for moving elastically the carrier up and down by means of air or vacuum supplied from the manifold, disposed between the manifold and the carrier.

According to other aspect of the present invention, there is provided an apparatus for polishing a semiconductor wafer including a polishing head comprising: a dish shaped carrier, a retainer ring disposed on an lower edge of the polishing head, having a space for receiving the wafer, a center supporter disposed in the carrier to provide a first chamber, a middle supporter disposed in the carrier on the same plane as the center supporter is disposed, to provide a second chamber, first and second membranes enclosing the center and middle supporters to be able to be separated from surface portions of the supporters, and a chucking ring disposed in the carrier to provide a third chamber.

In a preferred embodiment, a plurality of first holes are formed in the surface portion of the center supporter to communicate with the first chamber, a plurality of second holes are formed in the surface portion of the middle supporter to communicate with the second chamber, and a plurality of third holes are formed in the chucking ring to communicate with the third chamber.

In the embodiment, the chucking ring can be disposed between the center supporter and the middle supporter. Alternatively, the chucking ring can be disposed between the middle supporter and an inner surface of the carrier. The first, second and third chambers can have first, second and third fluid passages communicating external to the polishing head, respectively. Also, the middle supporter and the second membrane can be composed of ring shapes.

According to further aspect of the present invention, there is provided a method for polishing a wafer for use in an apparatus comprising a supporting portion having an abrasive pad disposed thereon; a polishing head disposed over the abrasive pad; and the polishing head comprising a carrier, a supporter disposed in the carrier to provide first and second chambers separated from each other, including a surface portion having a flat surface and a plurality of first and second holes formed therein to communicate with the first and second chambers, and a membrane enclosing a surface portion of the supporter to be able to be expanded and spaced apart from the surface portion, having a plurality of third holes corresponding to the first holes, comprising the step of positioning the membrane on a first surface of the wafer, taking the wafer up by making the first and second chambers communicating with the first and second holes vacuous or respectively vacuous and at atmospheric pressure to absorb and hold the wafer through the third holes, positioning the wafer on the abrasive pad to allow a second surface of the wafer to be in contact with the abrasive pad, expanding the membrane to impose load on the wafer by inputting air into the membrane through the first and second holes into the membrane, and polishing the second surface of the wafer by rotating the polishing head.

The method further includes the steps drawing the wafer upwardly by making the first and second chambers communicating with the first and second holes vacuous, or, respectively vacuous and at atmospheric pressure, to absorb and hold the wafer through is the third holes after the polishing step, and unloading the wafer from the polishing pad.

According to still other aspect of the present invention, there is provided a method for polishing a wafer for use in an apparatus comprising a dish shaped carrier, a retainer ring disposed on an lower edge of the polishing head, having a space for receiving the wafer, a center supporter disposed in the carrier to provide a first chamber communicating with a plurality of first holes, a middle supporter disposed in the carrier on the same plane as the center supporter is disposed, to provide a second chamber communicating with a plurality of second holes, first and second membranes enclosing the center and middle supporters to be able to be separated from surface portions of the supporters, and a chucking ring disposed in the carrier to provide a third chamber communicating with a plurality of third holes, comprising the step of positioning the chucking ring on a first surface of the wafer, drawing the wafer upwardly by making the first and second chambers communicating with the first and second holes vacuous or at atmospheric pressure, and the third chamber communicating with the third holes vacuous to absorb and hold the wafer through the third holes, positioning the wafer on the abrasive pad to allow a second surface of the wafer to be in contact with the abrasive pad, expanding the first and second membranes to impose load on the wafer by inputting air into the first and second membranes through the first and second holes, inputting air through the third holes to impose pressure on the first surface of the wafer, and polishing the second surface of the wafer by rotating the polishing head.

The method further includes the steps of taking the wafer up by making the first and second chambers communicating with the first and second holes vacuous or at atmospheric pressure, and the third chamber communicating with the third holes vacuous to absorb and hold the wafer through the third holes after the polishing step, and unloading the wafer from the polishing pad.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 6a to FIG. 6c are cross-sectional views showing the process steps of polishing the wafer by using the polishing head in accordance with the first embodiment of the present invention.

FIG. 7a is a cross-sectional view of a polishing head in accordance with a preferred second embodiment of the present invention, showing a state where pressure is imposed on the wafer.

FIG. 11a is a cross-sectional view of a polishing head in accordance with a preferred fourth embodiment of the present invention, showing a state where pressure is imposed on the wafer.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiment set forth herein; rather, these embodiments are provided so that this disclosure will be through and complete, and will fully cover the scope of the invention to those skilled in the art. Like numbers refer to like elements throughout.

Figure 1:
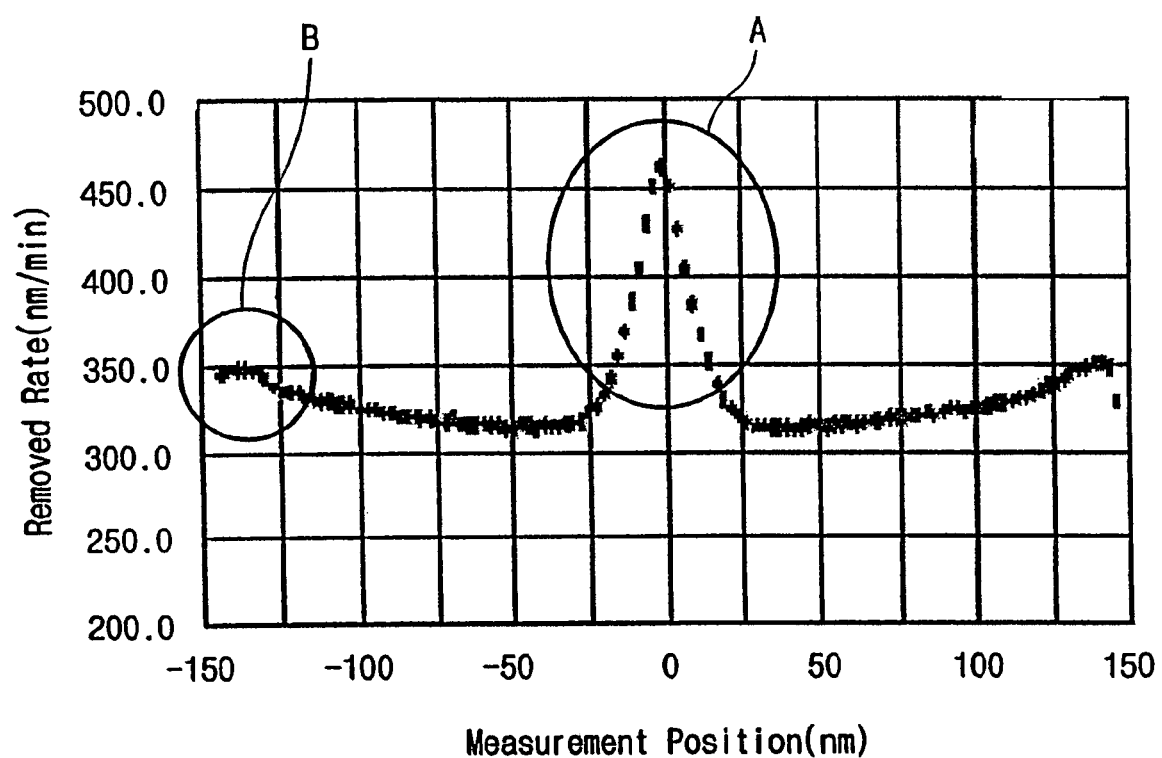
FIG. 1 is a graph showing an uneven polishing state of a wafer.
Figure 2:
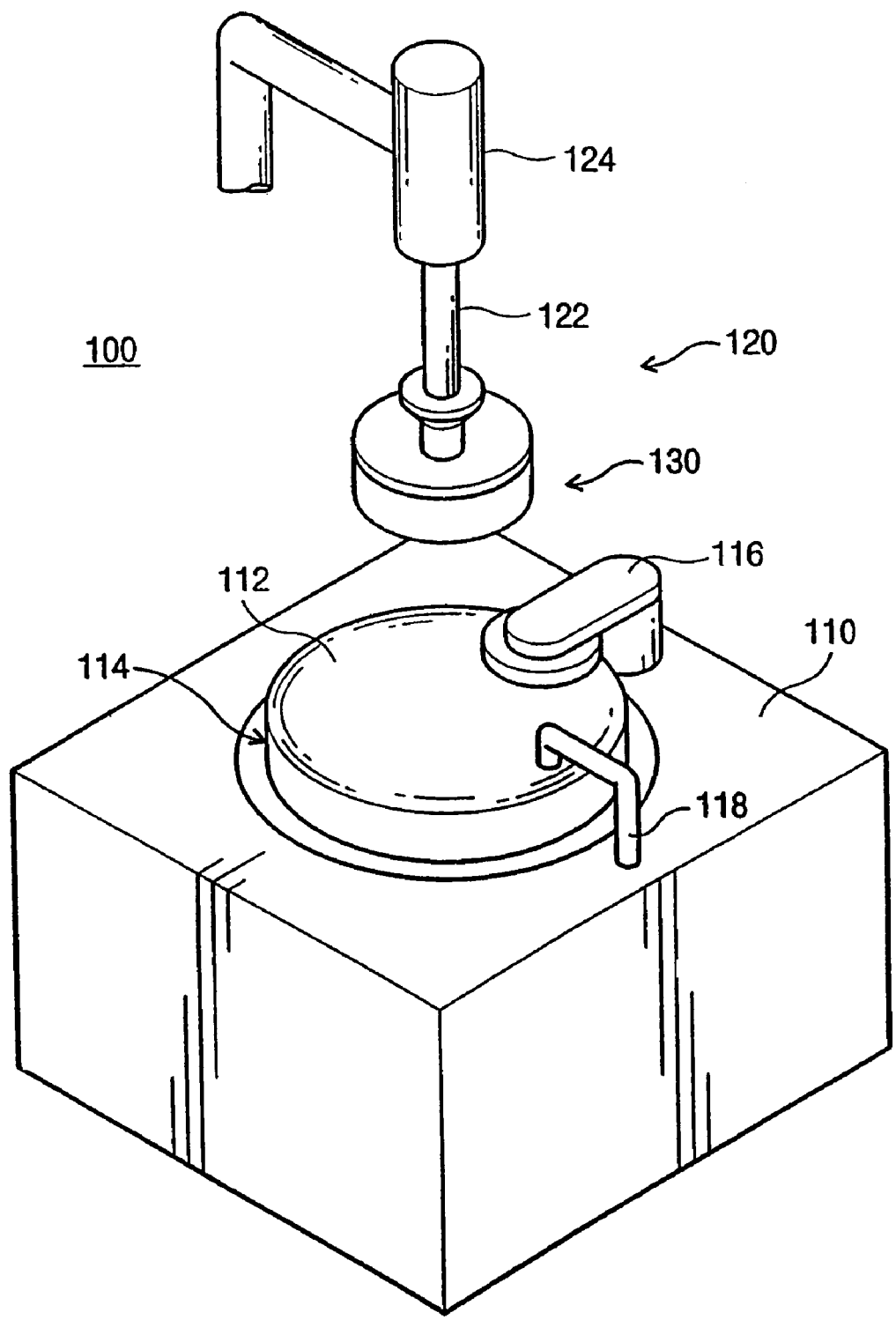
FIG. 2 is a perspective view of a CMP apparatus according to the present invention.

Referring now to FIG. 2, a general apparatus for CMP 100 to which the present invention is applied includes a polishing station 110 and a polishing head assembly 120.

On the polishing station 110, a rotatable turntable 114 connected with a device (not shown) for rotating the turntable is disposed. In a polishing process, the rotating device are rotated in about 50 to 80 RPM (revolutions per minute). The rotatable turntable 114 has an abrasive pad 112 mounted thereon. The abrasive pad 112 is composed of a circle-shaped plate of composite material having an uneven polishing surface.

The polishing station 110 includes a device 116 for conditioning the abrasive pad 112 and a device 118 for supplying slurries on the surface of the abrasive pad 112. The slurries are composed, for example, of a reaction reagent such as deionized water (DIW), abrasive particles such as silicon dioxide, and a chemical reaction catalyst such as potassium hydroxide for oxidation polishing. It is noted that since the conditioning device 116 and the slurry supplying device 118 are devices well-known in the art and not within the scope of the invention, they will not be explained in detail in the present application.

The polishing head assembly 120 of the apparatus for CMP 100 includes a polishing head 130, a driving axis 122 and a motor 124. The polishing head 130 functions to uniformly impose a downward pressure on a wafer 10 and maintain the wafer 10 (not shown) in contact with the abrasive pad 112. The polishing head 130 can be rotated in 40 to 70 RPM by means of the driving axis 122 coupled to the motor 124. The polishing head 130 is also connected to two fluid channels, each of which are coupled to a pump in order to supply air for pushing the wafer 10 or vacuum for capturing and holding the wafer 10.

Embodiment 1

Figure 3:
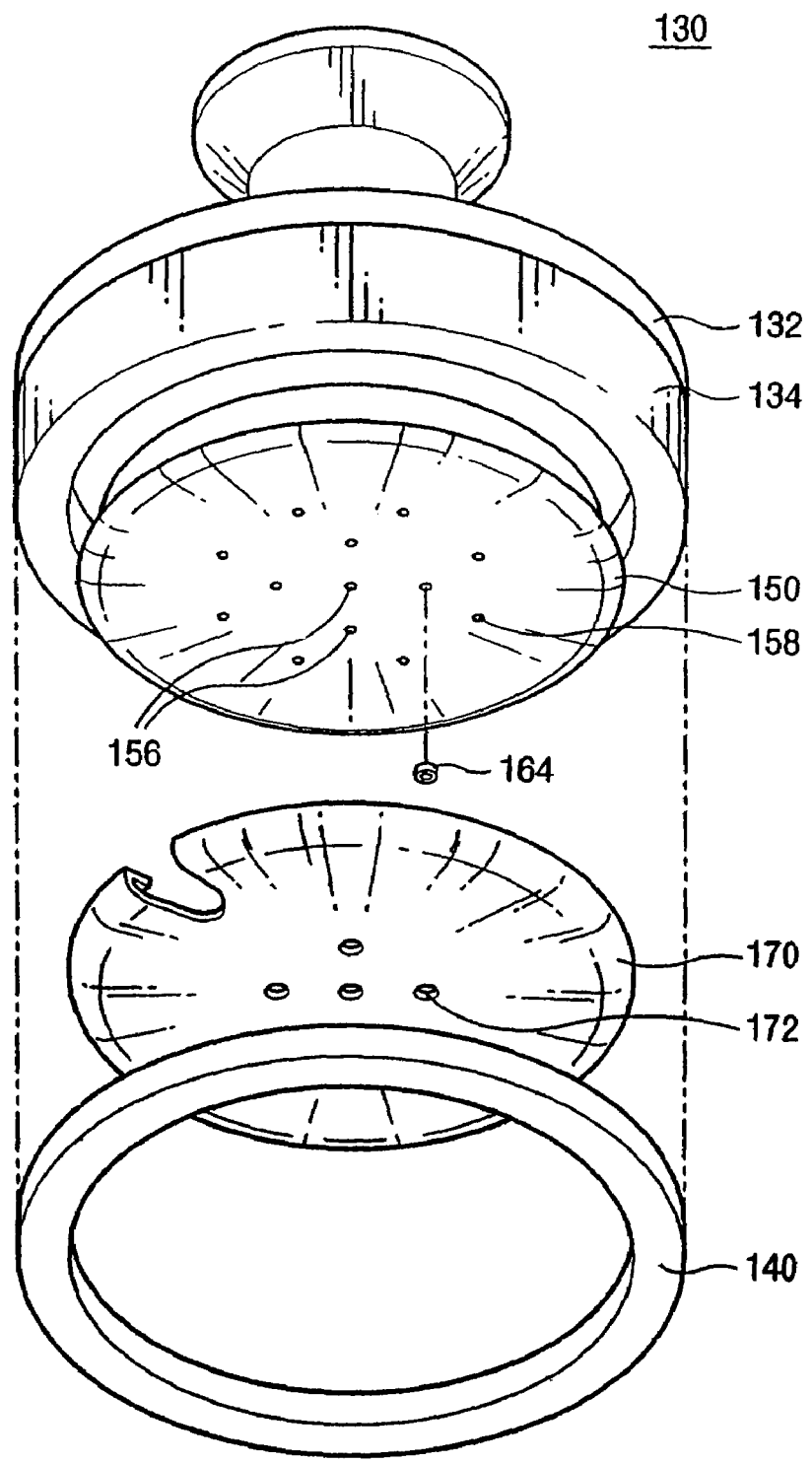
FIG. 3 is an exploded perspective view of a polishing head in accordance with a preferred first embodiment of the present invention.
Figure 4:
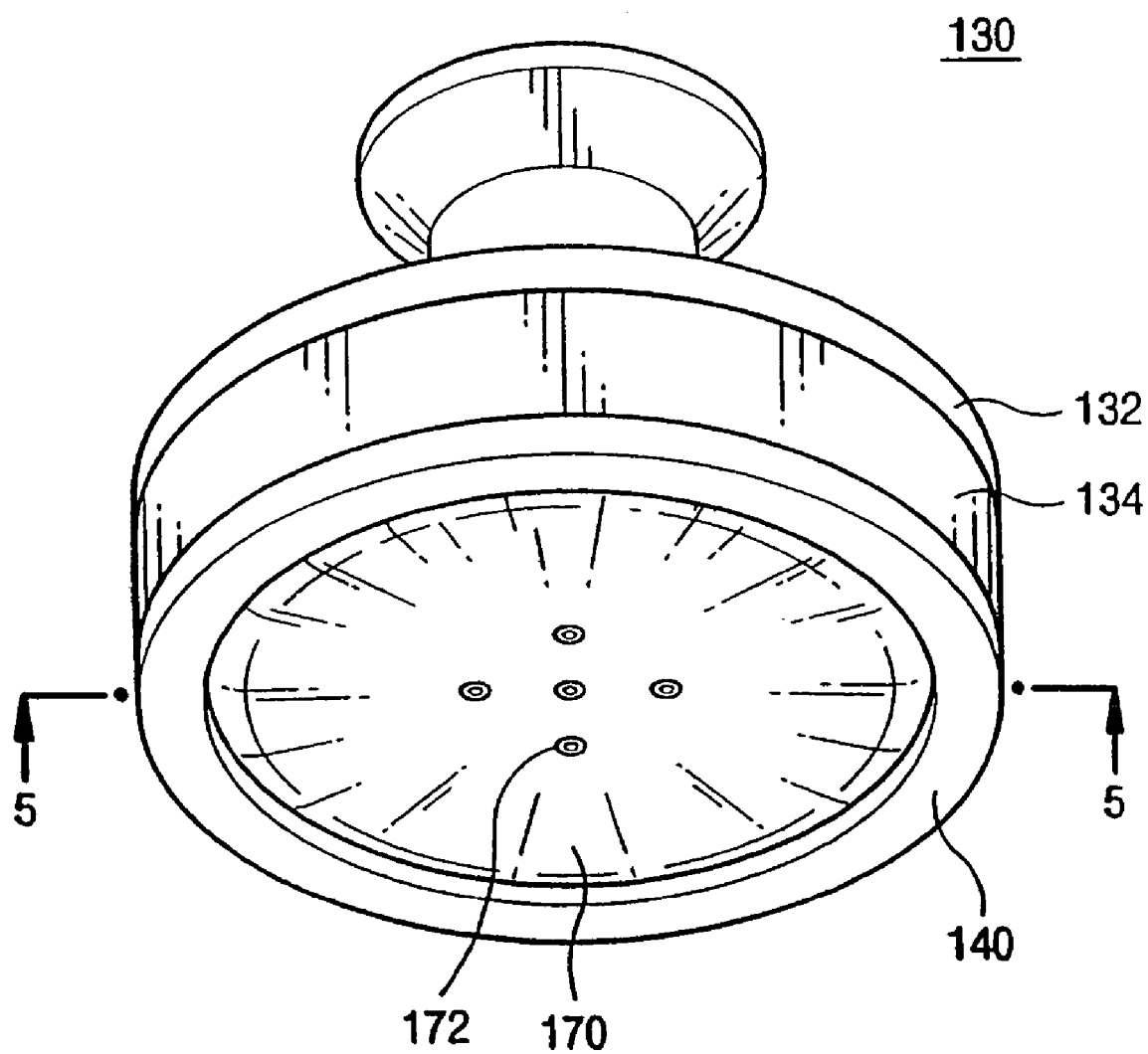
FIG. 4 is a perspective view of the polishing head shown in FIG. 3.
Figure 5:
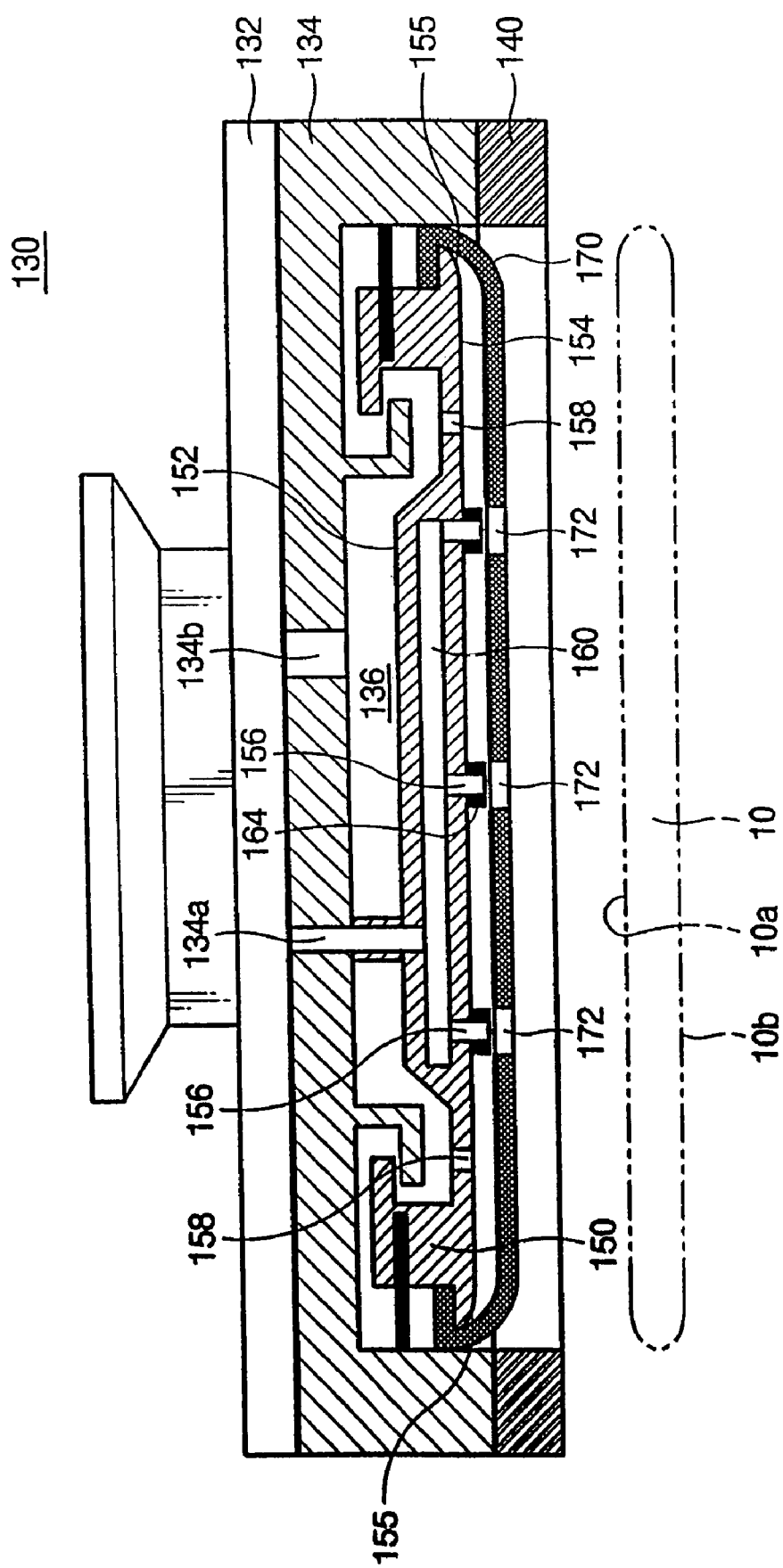
FIG. 5 is a cross-sectional view of the polishing head taken along line 5—5 of FIG. 4.

Referring to FIGS. 3 through 5, a polishing head 130 in accordance with a preferred first embodiment of the present invention includes a manifold 132, a dish-shaped carrier 134, a retainer ring 140, a supporter 150 and a flexible membrane 170. The manifold 132 is a component serving to connect the two fluid channels to first and second fluid passages 134a, 134b, as shown in FIG. 5. The supporter 150 disposed in the carrier 134 has an upper surface portion 152, a lower surface portion 154, a plurality of first holes 156, a plurality of second holes 158, and a first chamber 160. The upper surface portion 152 of the supporter 150 forms a second chamber 136 along with an inner surface of the carrier 134. The second chamber 136 communicates with the second fluid passage 134b of the carrier 134 and the second holes 158 formed in the lower surface portion 154 of the supporter 150. The first chamber 160 communicates with the first fluid passage 134a and the first holes 156. The lower surface portion 154 of the supporter 150 has a substantially planar flat surface or a substantially planar and rounded edge surface. Alternatively, the edge 155 of the lower surface portion 154 can be chamfered. The structure of the lower surface portion 154 includes a substantially planar flat surface and rounded edges in order to impose a uniform load on a rear or first surface 10a of the wafer 10 in a polishing process.

On the lower surface portion 154 of the supporter 150, films 164 are optionally adhered to operate as a medium in drawing and releasing of the wafer 10. The films 164 are adhered to the lower surface portion 154 of the supporter 150 in regions surrounding the first holes 156. Each film 164 is sized such that it is capable of insertion in respective corresponding third holes 172 of the membrane 170 and is of the same thickness as that of the membrane 170. Alternatively, the thickness of the films 164 can be formed to be less than that of the membrane 170.

The membrane 170 preferably comprises a thin rubber film which is in contact with the rear surface 10A of the wafer 10. When gas or liquid, preferably air is inputted into the membrane 170, it is expanded to impose uniformly load on the rear surface 10a of the wafer 10. The membrane 170 has a plurality of third holes 172 formed in portions thereof corresponding to the first holes 156 to absorb and hold the wafer 10 under vacuum.

Under an edge of a lower end of the carrier 134, a retainer ring 140 is disposed. The retainer ring 140 operates to prevent the wafer 10 from escaping from the polishing head 130 during polishing.

A wafer polishing process of an apparatus for CMP 100 having a polishing head 130 in accordance with the first embodiment of the present invention will now be described. The polishing process comprises the steps of loading a wafer 10 on an abrasive pad 112 of a turntable 114 by means of a polishing head 130, polishing a front or second surface 10b of the wafer 10 by imposing an air pressure on a membrane 170, chucking the wafer 10 by means of the polishing head 130, and unloading the wafer 10 on a stand-by stage (not shown) from the abrasive pad 112 of the turntable 114.

The steps of the polishing process will be explained in detail with reference to the following table.

TABLE 1

|  | The first chamber | The second chamber |
| --- | --- | --- |
| Loading step | Vacuum | Zero or vacuum |
| Polishing step | Pressure | Pressure |
| Chucking step | Vacuum | Zero or vacuum |
| Unloading step | Pressure | Any one of pressure, zero, vacuum (If possible, pressure) |

Figure 6A:
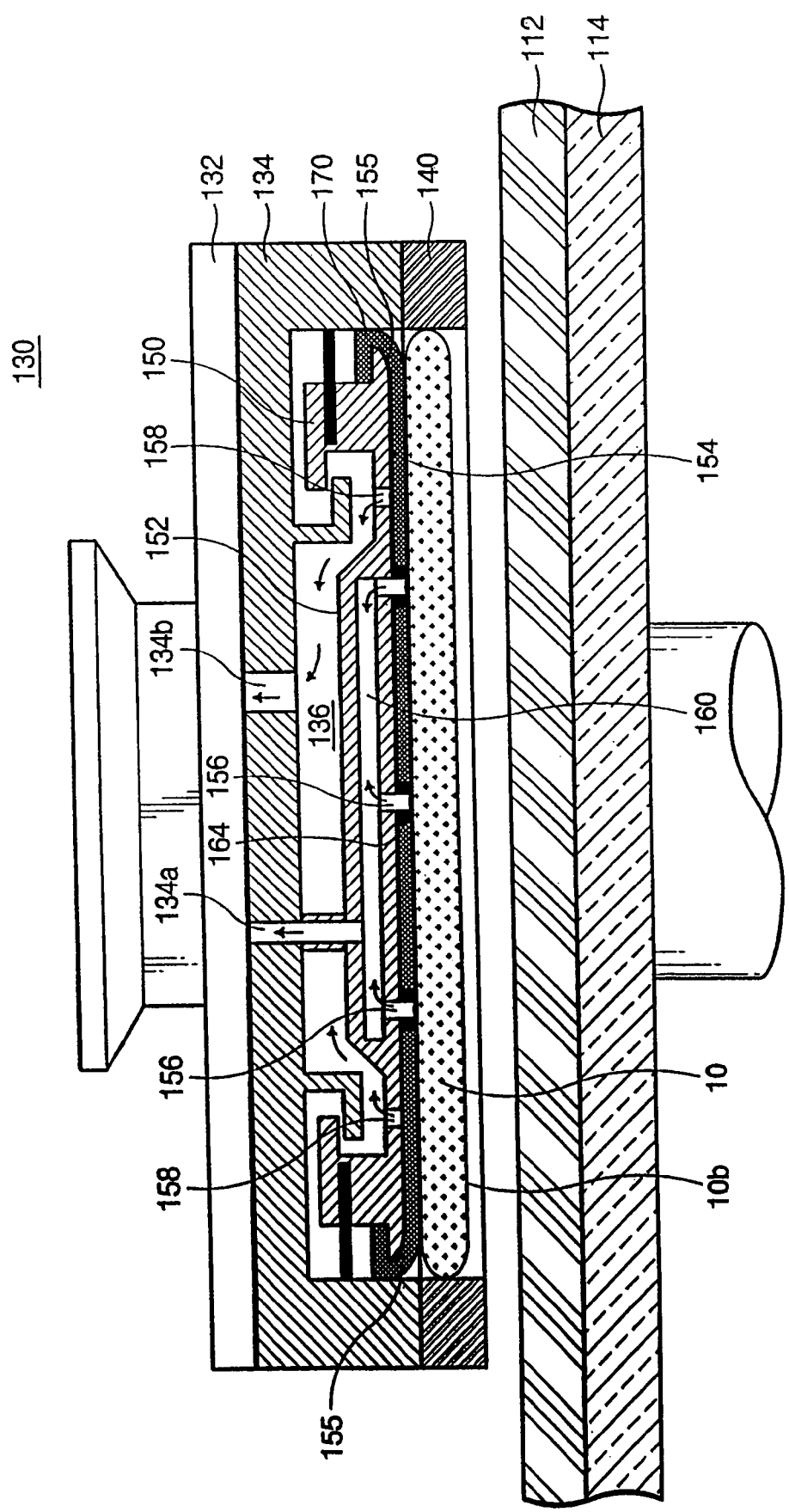

Referring to the table 1, in the loading step, the polishing head 130 is moved to bring the membrane 170 in contact with the rear surface 10a of the wafer 10. Then, gas, preferably air, is output, or discharged, through a first fluid passage 134a to make a first chamber 160 vacuous, and through a second fluid passage 134b to make a second chamber 136 at atmospheric pressure (called "zero" in the art) or vacuous. As a result, the wafer 10 is absorbed through first holes 156 of the supporter 150 and third holes 172 of the membrane 170 by compressing the membrane 170 against the underside of the supporter, as shown in FIG. 6a. Next, the wafer 10 adhered to the membrane 170 by vacuum is loaded on the abrasive pad 112 of the turntable 114 by means of the polishing head 130. At this time, the polishing head 130 is lowered until the wafer 10 is in contact in with the abrasive pad 112.

As shown in FIG. 6b, during the polishing step, air is input into the first and second chambers 160, 136 through the first and second fluid passages 134a, 134b. As a result, air pressure is provided through the first and second holes 156, 158 to the membrane 170 and thereby the membrane 170 is expanded, since the third holes 172 of the membrane 170 are blocked by means of the wafer 10. Expanded membrane 170 provides a uniform load over the entire rear surface 10a of the wafer 10. In this state, slurries are supplied through slurry supplying device, and the polishing head 130 and the turntable 114 are rotated in opposite directions to each other to polish the front surface 10b of the wafer 10.

As shown in FIG. 6c, during the chucking step following polishing, air is again discharged through the first fluid passage 134a to make the first chamber 160 vacuous, and through the second fluid passage 134b to make the second chamber 136 at atmospheric pressure or vacuous. As a result, the wafer 10 is absorbed through the first holes 156 of the supporter 150 and the third holes 172 of the membrane 170 while compressing the membrane 170, and adhered thereto. Next, the wafer 10 adhered to the membrane 170 by vacuum is unloaded on a stand-by stage from the abrasive pad 112 of the turntable 114 by means of the polishing head 130. Thereafter, air is input into the first 10 and second chambers 160, 136 through the first and second fluid passages 134a, 134b. As a result, the wafer adhered to the membrane 170 by vacuum is released from the membrane 170.

After performing the polishing process, a cleaning process can be carried out to remove slurries that had flowed between the membrane 170 and a lower surface portion 154 of the supporter 150. During the cleaning process, first, DIW and $N_2$ gas are continuously supplied into the second chamber 136 through the second fluid passage 134b. As a result, DIW and $N_2$ gas flows between the membrane 170 and the lower surface portion 154 of the supporter 150 through the second holes 158 communicating with the second chamber 136, to clean the slurries therebetween. Thus, the slurries are removed and thereby scratches generated on the wafers during subsequent processes due to the remaining slurry particles can be minimized.

As explained above, the polishing head 130 in accordance with the first embodiment of the present invention can prevent the wafer from being dropped while capturing the wafer since it draws the wafer up by absorbing and directly holding the wafer through the holes 172 of the membrane 170 by vacuum. Also, the problem of partial over-polishing of the wafer is eliminated since during the polishing step, the polishing head can impose a uniform load on the rear surface of the wafer by the substantially flat surface, or the flat surface and rounded edge of the lower surface of the supporter.

Figure 10A:
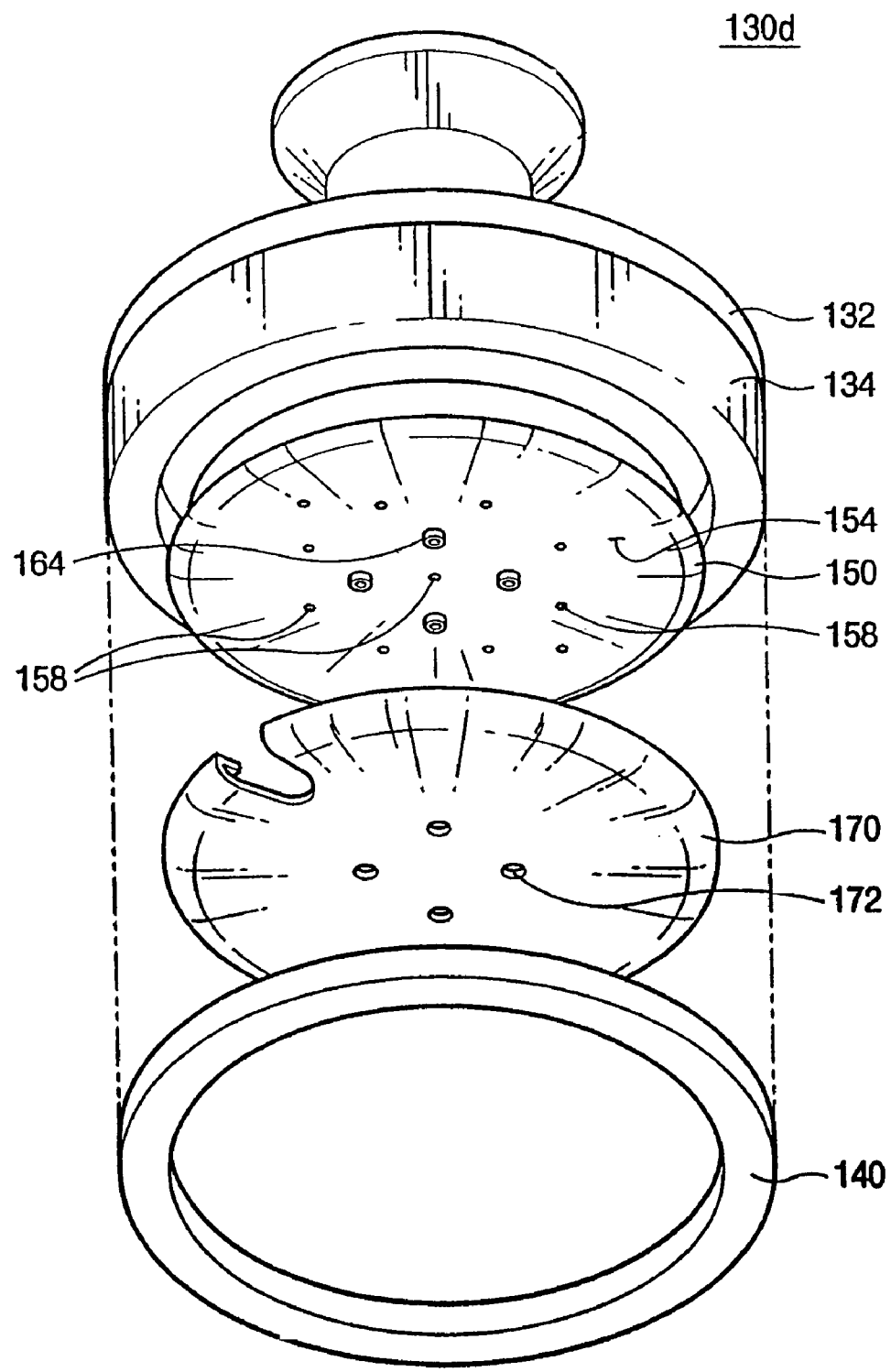
FIG. 10a to FIG. 10c are views showing a polishing head in accordance with an alternative first embodiment of the present invention.
Figure 10B:
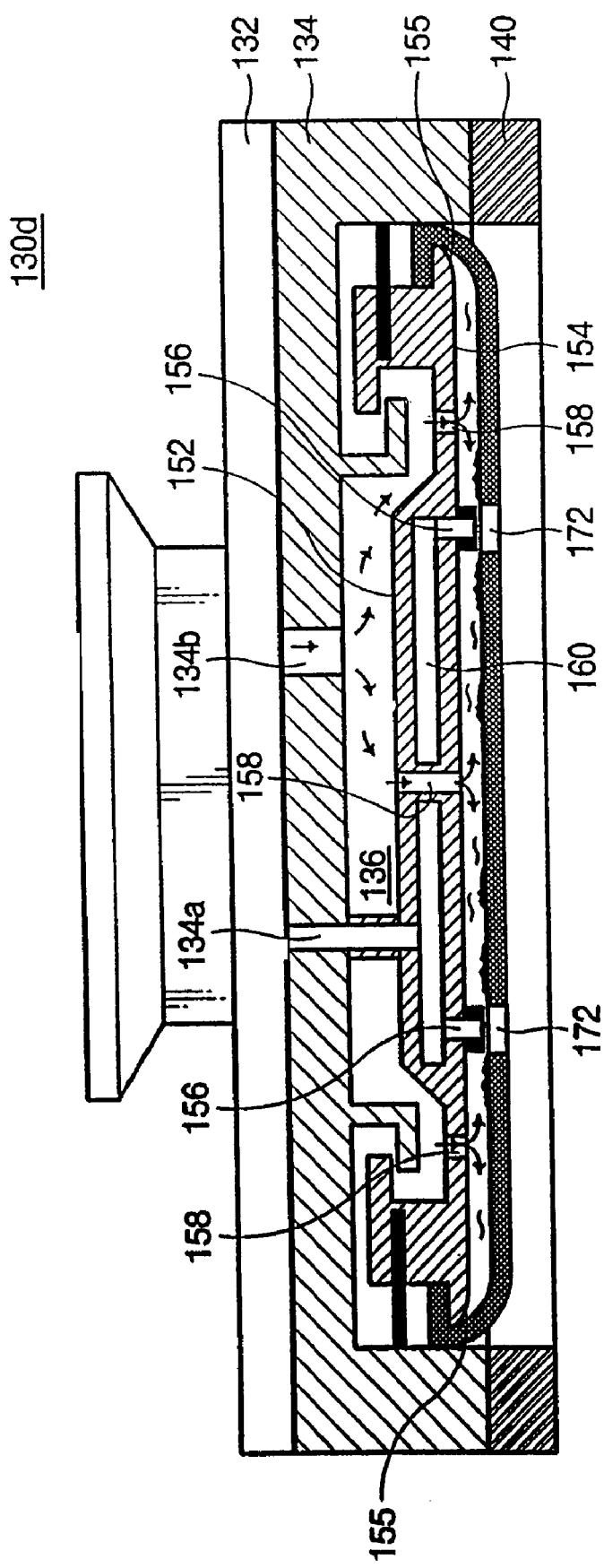
Figure 10C:
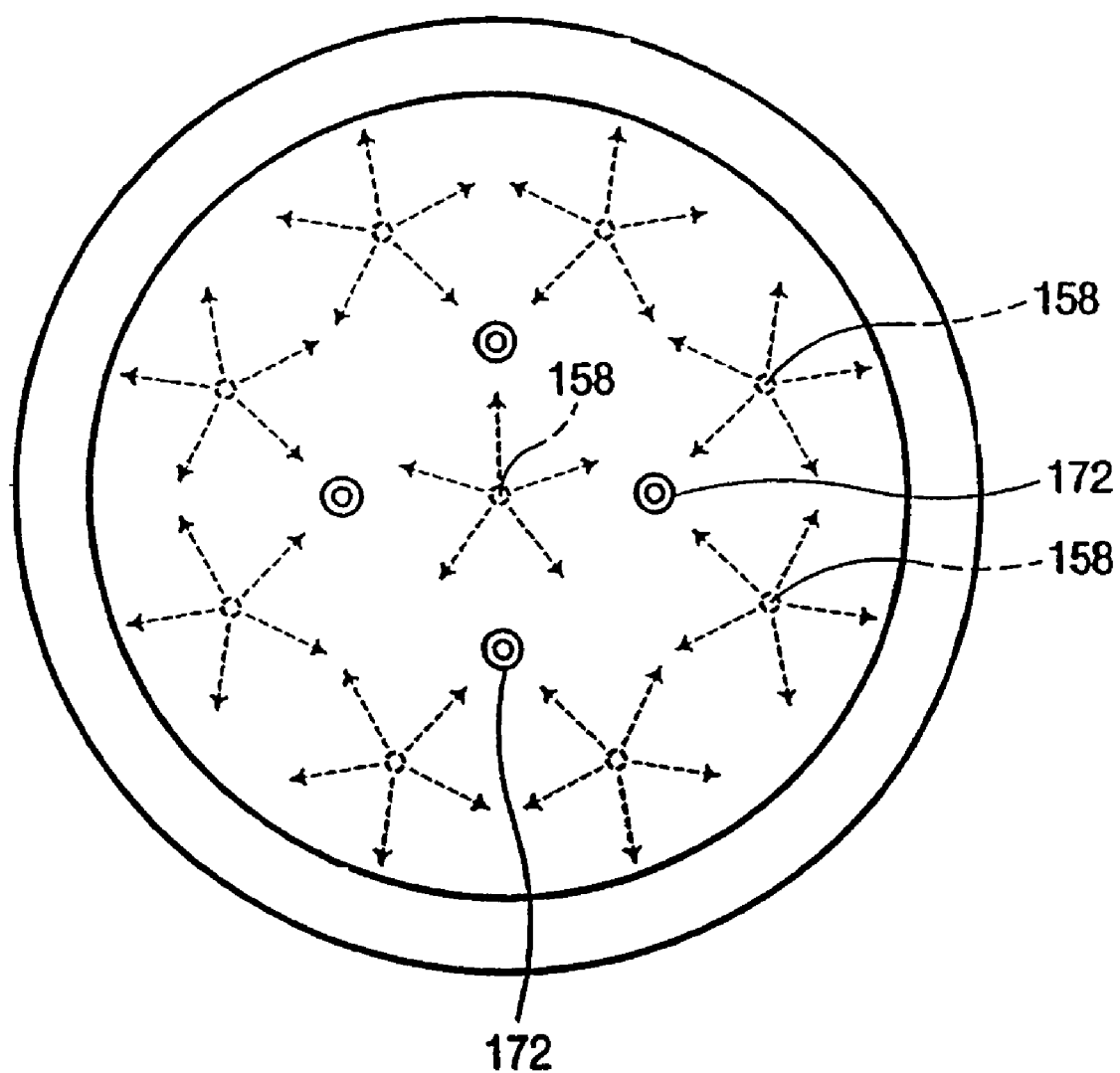

FIG. 10a to FIG. 10c are views showing a polishing head 130d in accordance with a alternative example of the first embodiment of the present invention.

Figure 9:
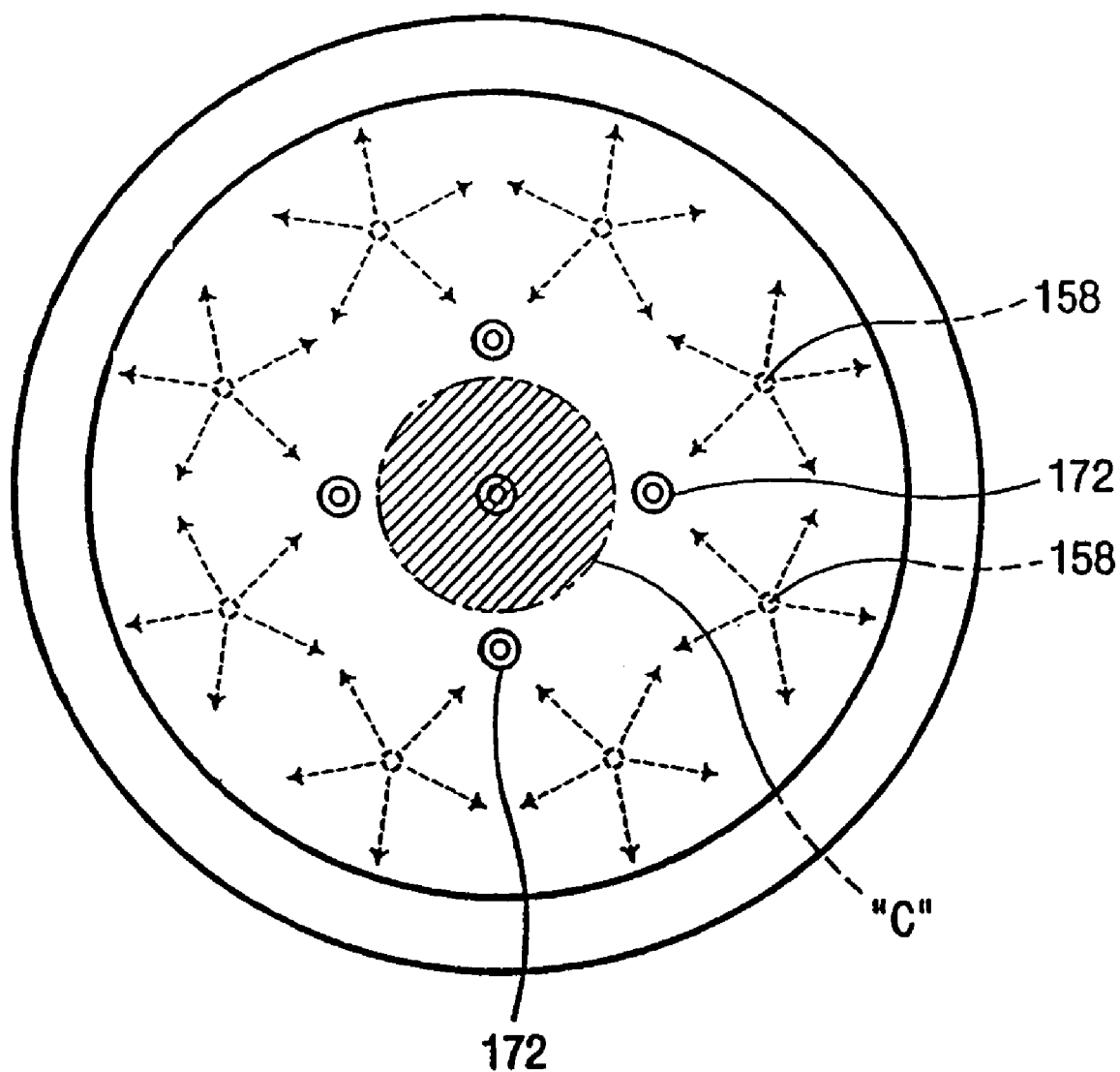
FIG. 9 is a bottom view of the polishing head in accordance with the first embodiment of the present invention.

In the cleaning process of the polishing head 130 of the first embodiment, DIW and $N_2$ gas are continuously supplied into the second chamber 136 through the second fluid passage 134b and then flowed between the membrane 170 and the lower surface portion 154 of the supporter 150 through the second holes 158 communicating with the second chamber 136 to clean remaining slurries therebetween. However, in this polishing head 130, most DIW gas that flowed through the second holes 158 is discharged through the third holes 172 adjacent to the second holes 158 before arriving at a center portion indicated by region "C" of the FIG. 9. As a result, the cleaning effect at the center portion "C"; is not as thorough as compared with that at the circumference of the second holes 158 since the amount of cleansing DIW arriving at the center portion "C" is less. To solve the problem, the polishing head 130d of the transformed example of the first embodiment is provided.

Referring to FIG. 10a through FIG. 10c, the polishing head 130d in accordance with the transformed example of the first embodiment has a second hole 158 formed at a center portion of a supporter 150 in communication with a second chamber 136. However, in a membrane 170, a hole corresponding to the second hole 158 of the center portion of the supporter 150 is not formed. Thus, in a polishing process, a sufficient amount of DIW and $N_2$ gas will flow into the center portion "C", as well as an edge portion, of the supporter 150, so that an uniform cleaning effect can be obtained.

Since the structure of the remainder of the polishing head 130d, (with the exception of the second hole 158 of the center portion of the supporter 150) is the same as that of the polishing head 130 of the first embodiment, it will not be explained in detail.

Embodiment 2

Figure 7B:
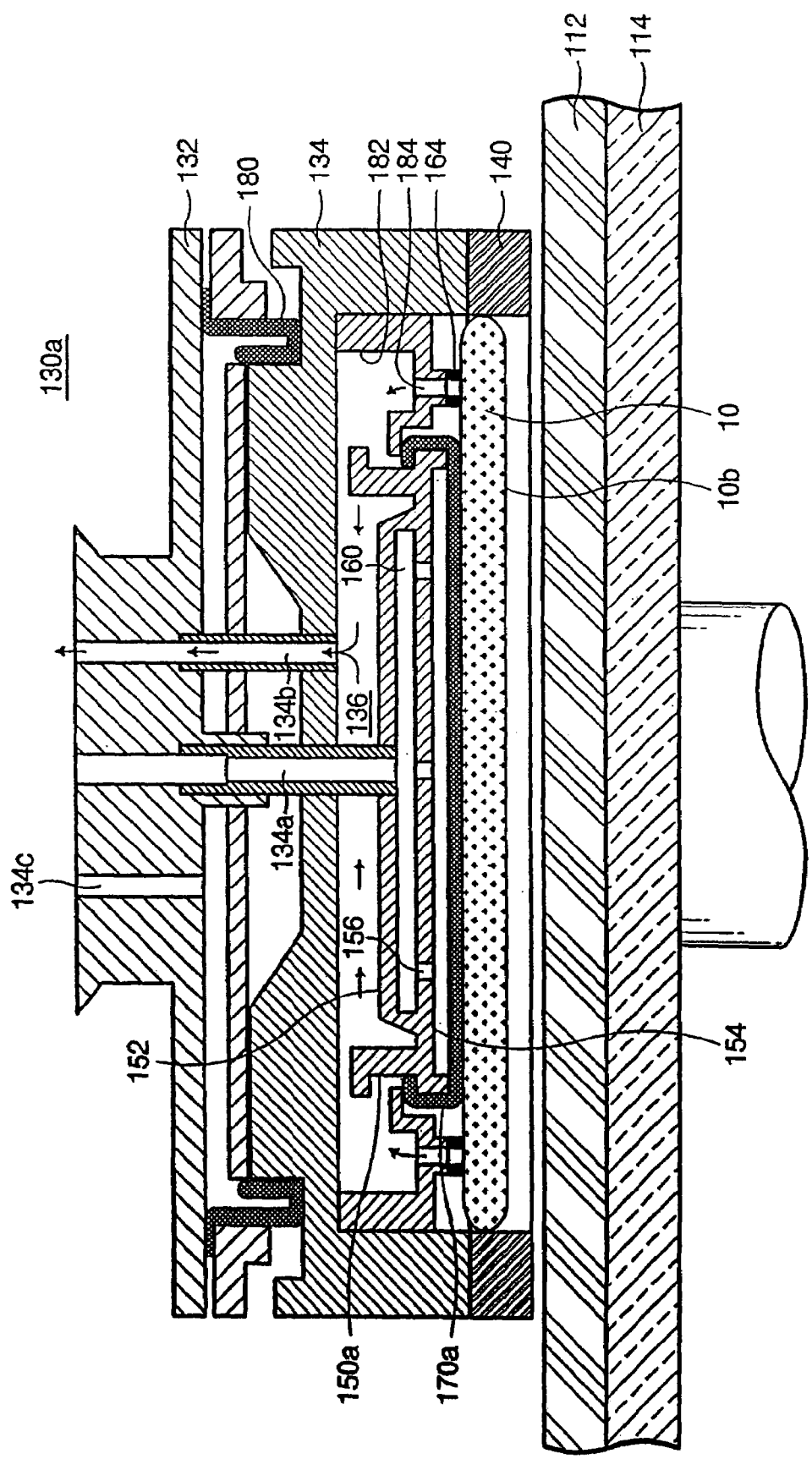
FIG. 7b is a cross-sectional view of the polishing head of FIG. 7a, showing a state where the wafer is upwardly drawn by vacuum.

FIG. 7a and FIG. 7b illustrate cross-sections of a polishing head 130a in accordance with a preferred second embodiment of the present invention. The polishing head 130a of the second embodiment is different than the polishing head 130 of the first embodiment in the sense that the load can be individually controlled at both the supporter 150a and the retainer ring 140. Also, the polishing head 130a has a separate chucking ring for use in moving of the wafer.

Downward pressure of the retainer ring 140 is controlled by air supplied through a third fluid passage 134c of a manifold 132. For this, a first elastic member 180 is disposed between the manifold 132 and a carrier 134. The elastic member 180 is expanded or compressed by air supplied through the third fluid passage 134c to impose load on the carrier 134. The carrier 134 is coupled with the retainer ring 140 to impose a downward load thereto. The elastic member 180 is composed of synthetic rubber, so that it can be expanded or compressed between the manifold 132 and the carrier 134 to buffer the carrier 134 and the retainer ring 140.

Also, the polishing head 130a includes a supporter 150a for imposing a uniformly distributed load on the wafer and a chucking ring 182 for capturing the wafer by vacuum. A first chamber 160 of the supporter 150a is in communication with a first fluid passage 134a in communication with the outside of the polishing head 130a, and first holes 156 formed on a lower surface portion 154 of the supporter 150a.

The chucking ring 182 forms a second chamber 136 communicating with a second fluid passage 134b along with an upper surface portion 152 of the supporter 150a and an inner surface of the carrier 134. The chucking ring 182 has a plurality of vacuum holes 184 for absorbing and holding the wafer by vacuum. On a lower surface of the chucking ring 182 at which the vacuum holes 184 are formed, films 164 are adhered, as described above. The films function as a medium for preventing scratches between the chucking ring 182 and the wafer 10 during chucking and release of the wafer 10.

During polishing, gas, preferably air, is input through the first fluid passages 134a to provide air pressure for pushing the wafer 10, and in capturing the wafer, and is input through the second fluid passages 134b to form vacuum for absorbing and holding the wafer 10.

A wafer polishing process of an apparatus for CMP 100 having a polishing head 130a in accordance with the second embodiment of the present invention will now be described. The polishing process comprises the steps of loading a wafer 10 on an abrasive pad 112 of a turntable 114 by means of a polishing head 130a, polishing a front or second surface 10b of the wafer 10 by imposing an air pressure on a membrane 170a, chucking the wafer 10 by means of the polishing head 130a, and unloading the wafer 10 on a stand-by stage (not shown) from the abrasive pad 112 of the turntable 114.

The steps of the polishing process are explained in detail with reference to the following table.

TABLE 2

|  | The first chamber | The second chamber | The third fluid passage |
|---|---|---|---|
| Loading step | Zero or vacuum | Vacuum | Pressure → zero |
| Polishing step | Pressure | Pressure | Pressure |
| Chucking step | Zero or vacuum | Vacuum | Pressure → zero |
| Unloading step | Any one of Pressure, zero, and vacuum (If possible, pressure) | Pressure | Zero |

Referring to the table 2, during the loading step, the polishing head 130a is moved to allow the membrane 170a to be in contact with the rear surface 10a of the wafer 10. Then, gas or liquid, preferably air, is discharged through a first fluid passage 134a to make a first chamber 160 vacuous or at atmospheric pressure, and through a second fluid passage 134b to make a second chamber 136 vacuous. At this time, through a third fluid passage 134c, air is pumped to lower the carrier 134 downward until the wafer 10 is completely absorbed and retained or chucked by vacuum. After drawing the wafer 10 in an upward direction, air is discharged through the third fluid passage 134c to maintain downward pressure of the carrier 134 at atmospheric pressure. As a result, as shown in FIG. 7b, the wafer 10 is absorbed and drawn by vacuum holes 184 of the chucking ring 182 while compressing the membrane 170a.

The wafer 10 is then loaded on the abrasive pad 112 of the turntable 114 by means of the polishing head 130a. At this time, the polishing head 130a is lowered until the wafer 10 is in contact in with the abrasive pad 112.

As shown in FIG. 7a, during the polishing step, air is pumped into the first and second chambers 160, 136 and the first elastic member 180 through the first, second and third fluid passages 134a, 134b, 134c. As a result, the air pressure is provided through the 45 first holes 156 to the membrane 170a to expand the membrane 170a, and through the vacuum holes 184 to an edge of the wafer 10 to impose a load thereon. The elastic member 180 is likewise expanded to impose load on the carrier 134. In this state, slurries are supplied through slurry supplying device 118, and the polishing head 130a and the turntable 114 are rotated in opposite directions to each other to polish the front surface 10b of the wafer 10.

As shown in FIG. 7b, during the chucking step after polishing, air is again discharged through the first fluid passage 134a to make the first chamber 160 vacuous or at atmospheric pressure, and through the second fluid passage 134b to make the second chamber 136 vacuous. At this time, air is pumped through the third fluid passage 134c to lower the carrier 134 downward until the wafer 10 is completely absorbed and drawn by vacuum. After drawing the wafer 10 up, air is discharged through the third fluid passage 134c to maintain downward pressure of the carrier 134 at atmospheric pressure. As a result, the wafer 10 is absorbed and drawn by the vacuum holes 184 of the chucking ring 182 while compressing the membrane 170a. Then, the wafer 10 drawn through the vacuum holes 184 is unloaded on the stand-by stage from the abrasive pad 112 of the turntable 114 by means of the polishing head 130a. Thereafter, air is pumped into the first and second chambers 160, 136 through the first and second fluid passages 134a, 134b. As a result, the wafer is separated and released from the vacuum holes 184.

As explained above, the polishing head 130a of the second embodiment is characterized in that it has a separate chucking ring 182 for drawing the wafer up by vacuum. During the polishing process, the chucking ring 182, through the vacuum hole 180 independently imposes a pressure on the edge of the wafer 10, while a pressure through the first hole 134a is imposed on the center portion of the wafer 10. Also, the polishing head 130a can individually control load to be imposed on each of the supporter 150a and the retainer ring 140.

The structure and operation of the polishing head 130a of the second embodiment described above is otherwise the same as that of the polishing head 130 of the first embodiment.

Embodiment 3

Figure 8A:
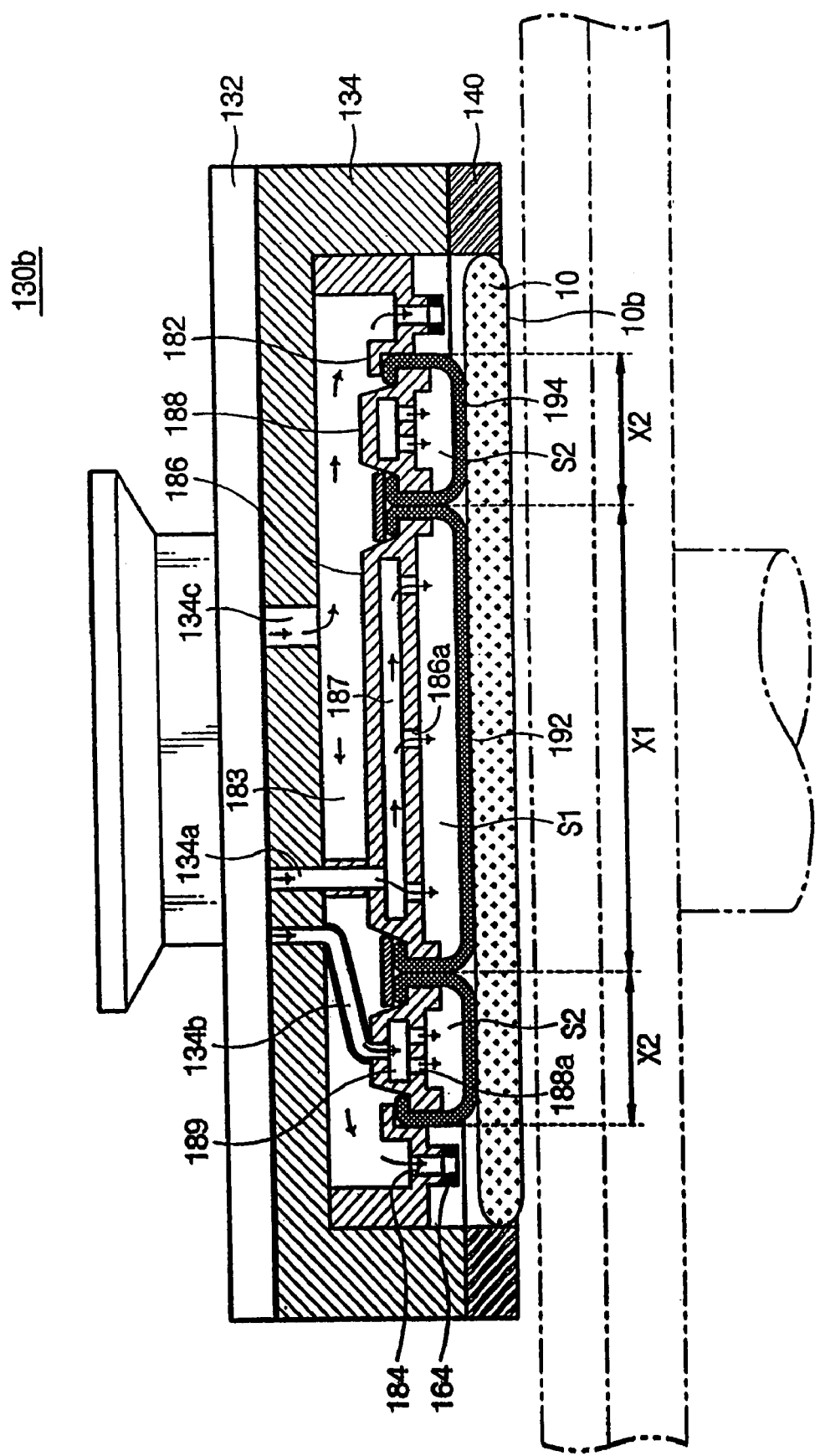
FIG. 8a is a cross-sectional view of a polishing head in accordance with a preferred third embodiment of the present invention, showing a state where pressure is imposed on the wafer.
Figure 8B:
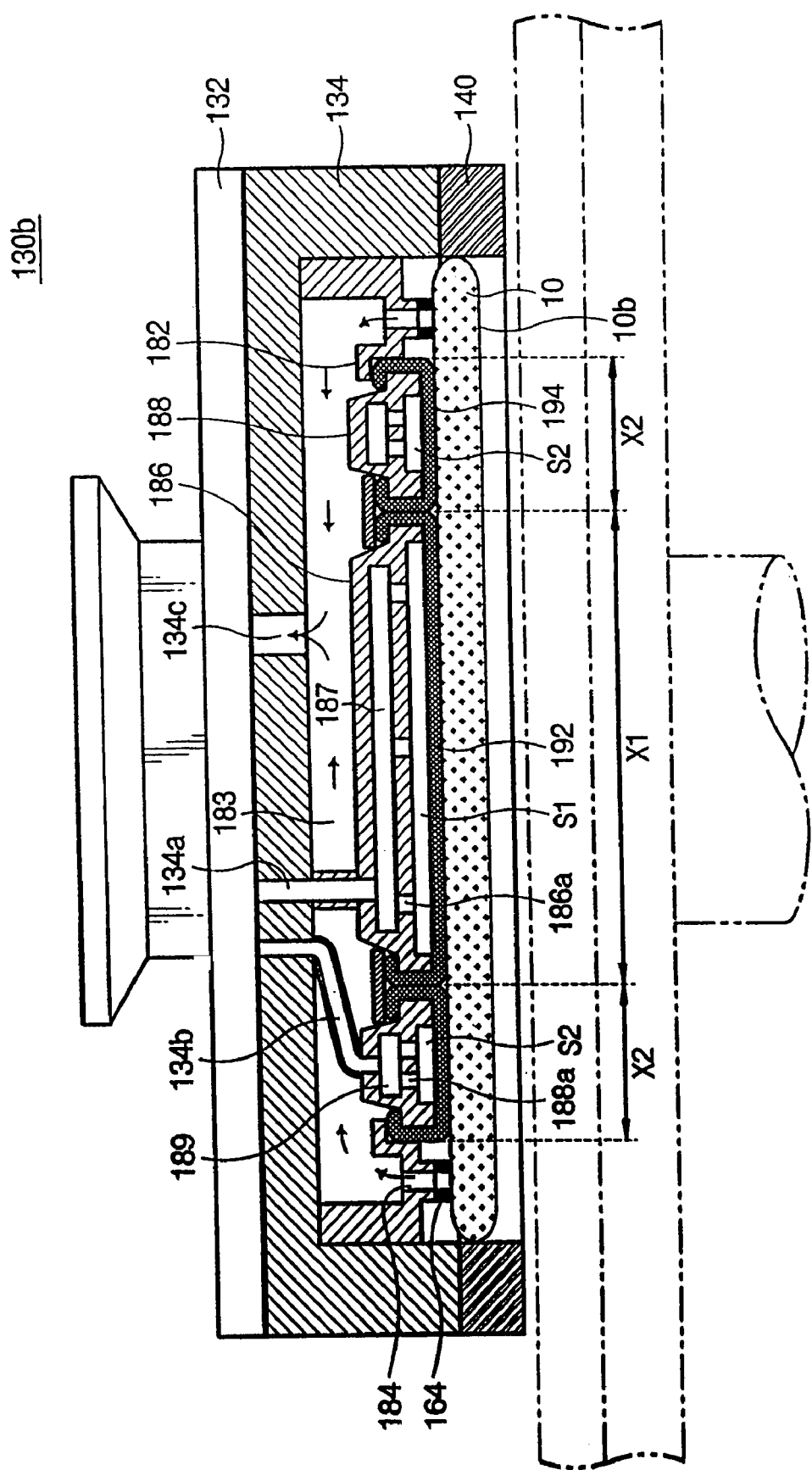
FIG. 8b is a cross-sectional view of the polishing head of FIG. 8a, showing a state where the wafer is upwardly drawn by vacuum.

FIG. 8a and FIG. 8b show cross-sections of a polishing head 130b in accordance with a preferred third embodiment of the present invention. The polishing head 130b of the third embodiment is different than the polishing head 130 of the first embodiment in that it can individually control load to be imposed on each of first and second regions X1, X2, and also has a separate chucking ring for drawing the wafer as in the second embodiment.

The polishing head 130b of the third embodiment includes a carrier 134, a center supporter 186, a middle supporter 188, a first membrane 192, a second membrane 194 and a chucking ring 182.

The carrier 134 includes first, second, and third fluid passages 134a, 134b, 134c. The center supporter 186 has a first chamber 187 communicating with the first fluid passage 134a, and a lower surface portion having first holes 186a to communicate with the first chamber 187. Through the first fluid passage 134a, air is pumped into the first chamber 187 to impose load on a first area x1 of the wafer 10.

The middle supporter 188 disposed around the center supporter 186 in the carrier 134 is positioned on the same plane as that of the center supporter 186. The middle supporter 188 has a second chamber 189 communicating with the second fluid passage 134b, and a lower surface portion having second holes 188a to communicate with the second chamber 189. Through the second fluid passage 134b, air is input into the second chamber 189 to force load on a second area x2 of the wafer 10.

The first and second membranes 192, 194 are adhered to edges of the center and middle supporters 186, 188 to enclose the lower surface portions thereof, respectively. The second membrane 194 enclosing the middle supporter 188 and the lower surface portion thereof is composed of a ring shape.

Downward loads of the first and second membranes 192, 194 against the first and second areas X1, X2 of the wafer 10 are controlled by means of air pressure in the first and second chamber 187, 189. Namely, loads of the first and second areas X1, X2 of the wafer 10 are controlled by changing air pressures of the first and second fluid passages 134a, 134b of the carrier 134.

Thus, the loads which are imposed on certain portions X1, X2 of the wafer 10 can be readily controlled and thereby relative polishing speeds of the certain portions X1, X2 of the wafer 10 can be more precisely controlled.

The chucking ring 182, along with an inner surface of the carrier 134 and upper surfaces of the supporters 186, 188 forms a third chamber 183 communicating with the third fluid passage 134c. The chucking ring 182 has vacuum holes 184 for drawing the wafer up by vacuum. On a lower surface of the chucking ring 182 in which the vacuum holes 184 are formed, films 164 are adhered. The films 164 operate as a medium for preventing scratches of the wafer 10 due to the chucking ring 182 in chucking and releasing of the wafer 10.

A wafer polishing process of an apparatus for CMP 100 having a polishing head 130b in accordance with the third embodiment of the present invention will now be described. The polishing process comprises the steps of loading a wafer 10 on an abrasive pad 112 of a turntable 114 by means of a polishing head 130b, polishing a front or second surface 10b of the wafer 10 by imposing air pressure on first and second membranes 192, 194, chucking the wafer 10 by means of the polishing head 130b, and unloading the wafer 10 on a stand-by stage (not shown) from the abrasive pad 112 of the turntable 114.

The steps of the polishing process are now explained in detail with reference to the following table.

TABLE 3

|  | The first and second chamber | The third chamber |
| --- | --- | --- |
| Loading step | Zero or vacuum | Vacuum |
| Polishing step | Pressure | Pressure |
| Chucking step | Zero or vacuum | Vacuum |
| Unloading step | Any one of Pressure, zero, and vacuum (If possible, pressure) | Pressure |

Referring to the table 3, in the loading step, the polishing head 130b is moved to allow the first and second membranes 192,194 to be in contact with the rear surface 10a of the wafer 10. Then, gas, preferably air, is discharged through first and second fluid passages 134a, 134b to make the first and second chambers 187, 189 vacuous, or at atmospheric pressure, and through a third fluid passage 134c to make a third chamber 183 vacuous. As a result, as shown in FIG. 8b, the wafer 10 is absorbed and retained at vacuum holes 184 of a chucking ring 182 while compressing the first and second membranes 192, 194.

The wafer 10 is next loaded on the abrasive pad 112 of the turntable 114 by means of the polishing head 130b. At this time, the polishing head 130b is lowered until the wafer 10 is in contact in with the abrasive pad 112.

As shown in FIG. 8a, in the polishing step, air is individually input into the first, second and third chambers 187, 189, 183 through the first, second and third fluid passages 134a, 134b, 134c. As a result, the air pressure is provided through the first and second holes 186a, 188a to the first and second membranes 192, 194 to expand them, and thereby first and second spaces S1, S2 are formed between the center supporter 186 and the first membrane 192 and between the middle supporter 188 and the second membrane 194, respectively. Air pressure in the first and second spaces S1, S2 forces the first and second areas X1, X2 of the wafer 10 to be pushed. Also, a slight load is imposed on an edge of the wafer 10 by means of air supplied through the vacuum holes 184. In this state, slurries are supplied through slurry supplying device 118, and the polishing head 130b and turntable 114 are rotated in opposite directions with respect to each other to polish the front surface 10b of the wafer 10.

As shown in FIG. 8b, during the chucking step after polishing, air is again discharged through the first and second fluid passages 134a, 134b to make the first and second chambers 187, 189 vacuous or at atmospheric pressure, and through the third fluid passage 134c to make the third chamber 183 vacuous. As a result, the wafer 10 is absorbed and chucked or took up through the vacuum holes 184 of the chucking ring 182 while compressing the first and second membranes 192, 194. Next, the wafer 10 is unloaded on the stand-by stage from the abrasive pad 112 of the turntable 114 by means of the polishing head 130b. Thereafter, air is input into the third chamber 183 through the third fluid passage 134c. As a result, the wafer is separated and released from the vacuum holes 184.

As explained above, the polishing head 130b of the third embodiment is characterized in that it has a separate chucking ring 182 for taking the wafer up by vacuum and providing a space or a volume to impose a portion of the wafer 10 by supplying air through the first fluid passage 134c. Also, the polishing head 130b can individually control load to be imposed on certain portions of the wafer.

Also, it will be noted that in the polishing head 130b of the third embodiment, membranes are disposed respectively on the center and middle supporters, but plural membranes can be disposed on one supporter or conversely one membrane is disposed on plural supporters. Also, spaces formed by means of one or plural membranes and supporters respectively communicate with corresponding fluid passages to individually control the air pressure therein.

Embodiment 4

Figure 11B:
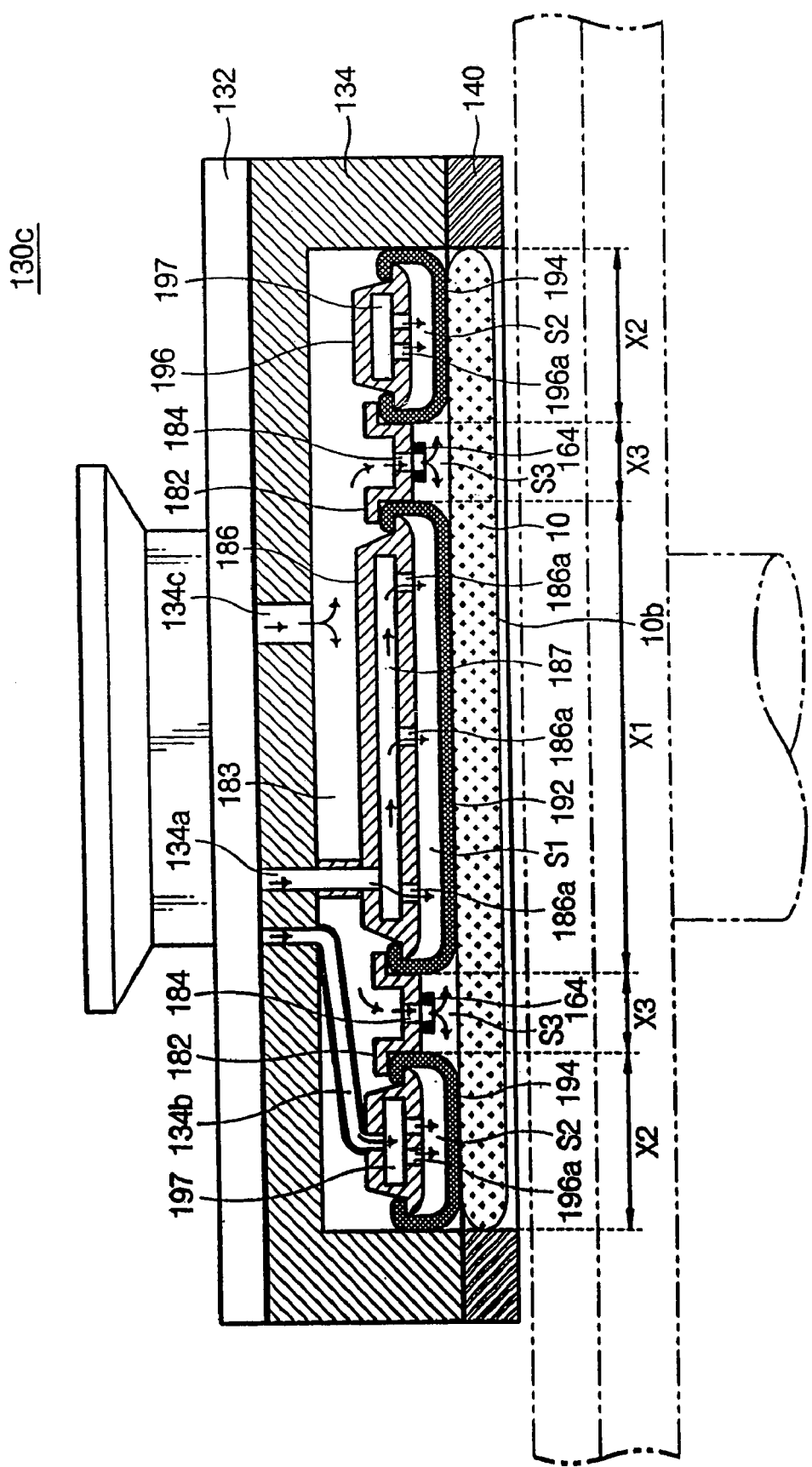
FIG. 11b is a cross-sectional view of the polishing head of FIG. 11a, showing a state where the wafer upwardly drawn by vacuum.

FIG. 11a and FIG. 11b show cross-sections of a polishing head 130c in accordance with a preferred fourth embodiment of the present invention. The polishing head 130c of the fourth embodiment is characterized in that it can individually control load to be imposed on each of first, second and third areas X1, X2, X3, and has a chucking ring for taking the wafer up. The chucking ring 182 is disposed between supporters having improved lower surface portions.

Referring to FIG. 11*a*, the polishing head 130*c* of the fourth embodiment includes a carrier 134, a center supporter 186, an end supporter 196, a first membrane 192, a second membrane 194 and a chucking ring 182.

The carrier 134 has first, second, and third fluid passages 134*a*, 134*b*, 134*c*. The center supporter 186 has a first chamber 187 communicating with the first fluid passage 134*a*, and a lower surface portion of the center supporter 134*a* having first holes 186*a* to communicate with the first chamber 187. Through the first fluid passage 134*a*, air is input into the first chamber 187 to force a load on a first area X1 of the wafer 10.

The chucking ring 182 disposed about the center supporter 186 in the carrier 134 is positioned on the same plane as that of the center supporter 186.

The end supporter 196 is disposed around the chucking ring 182 in the carrier 134 and positioned on the same plane as that of the center supporter 186. The end supporter 196 has a second chamber 197 communicating with the second fluid passage 134*b*, and a lower surface portion having second holes 196*a* to communicate with the second chamber 197. Through the second fluid passage 134*b*, air is input into the second chamber 196 to force a load on a second area X2 of the wafer 10.

Each of the lower surface portions of the center and end supporters 186, 196 is a flat surface having a rounded edge. Alternatively, edges of the lower surface portions can be chamfered. The structure of the lower surface portions having flat surfaces and rounded edges functions to impose uniformly load on a rear or first surface 10*a* of the wafer 10 during a polishing process.

The chucking ring 182 along with an inner surface of the carrier 134 and upper surfaces of the supporters 186, 196 forms a third chamber 183 communicating with the third fluid passage 134*c*. The chucking ring 182 has vacuum holes 184 for taking the wafer up by vacuum. On a lower surface of the chucking ring 182 in which the vacuum holes 184 are formed, films 164 are disposed. The films 164 operate as a medium for preventing scratches of the wafer 10 due to the chucking ring 182 during chucking and releasing of the wafer 10.

The first and second membranes 192, 194 are disposed at the edges of the center and end supporters 186, 196 to enclose the lower surface portions thereof, respectively. The second membrane 194 enclosing the end supporter 196 and the lower surface portion thereof is composed of a ring shape.

As shown in FIG. 11*b*, when air is individually pumped into the first and second chambers 187, 197 through the first and second fluid passages 134*a*, 134*b*, air pressure is provided through the first and second holes 186*a*, 196*a* to the first and second membranes 192, 194 to expand them, and thereby first and second spaces or volumes S1, S2 are formed between the center supporter 186 and the first membrane 192 and between the end supporter 196 and the second membrane 194, respectively. At this time, between the chucking ring 182 and the wafer 10, a third space or volume S3 is formed by means of the first and second membranes 192, 194. Thus, the polishing head 130*c* of this embodiment is characterized in that a separate chucking ring 182 is operated by air, and the third space S3 is formed spontaneously by expanding the first and second membranes 192, 194. Also, air pressures of the spaces S1, S2, S3 can be individually controlled by means of the first, second, and third fluid passages 134*a*, 134*b*, 134*c*, respectively.

During a polishing step, downward loads against the first, second, and third areas X1, X2, X3 of the wafer 10 can be controlled by means of air pressures in the first, second and third chambers 187, 197, 183. Namely, air supplied to the first and second chambers 187, 197 flows into the first and second membranes 192, 194 and expands them to form the first and second spaces S1, S2 providing load against the first and second areas X1, X2 of the wafer 10, and air supplied to the third chamber 183 flows into the third space S3 between the first and second membranes 192, 194 to provide load against the third area X3 of the wafer 10. Thus, the loads which are imposed on certain portions X1, X2, X3 of the wafer 10 can be easily controlled by changing pressures of air supplied through the fluid passages 134*a*, 134*b*, 134*c* of the carrier 134 and thereby polishing speed, or removal rate, of the certain portions X1, X2, X3 of the wafer 10 can be more precisely controlled.

Films 164 disposed as a medium in the first, second, third and fourth embodiments are optional.

The remaining structure and operation of the polishing head 130*c* described above is the same as that of the polishing heads of the first and second embodiments.

As apparent from the foregoing description, it can be appreciated that the present invention provides an apparatus for polishing a wafer which can more stably load and unload the wafer by absorbing and chucking it by vacuum.

Also, the present invention can prevent a certain portion of a wafer from being over-polished by imposing uniformly load on a rear surface of the wafer in a polishing process.

Further, the present invention can easily control load to be imposed on certain areas of a wafer by providing a plurality of spaces separated from each other by means of supporters and membranes, and thereby precisely control the polishing speed of the certain portions of the wafer.

Still further, the present invention can prevent scratches from being generated due to the polishing head by cleansing slurry particles flowing in between membranes and supporters during the polishing process.

In the drawings and specification, there have been disclosed typical preferred embodiments of the invention and, although specific terms are employed, they are used in a generic and descriptive sense only and not for the purpose of limitation, the scope of the invention being set forth in the following claims.

What is claimed is:

1. A method for polishing a wafer, comprising the steps of:
   vacuum-absorbing a wafer through a vacuum hole of a membrane positioned under a polishing head;
   locating the vacuum-absorbed wafer on a polishing pad; and
   polishing the wafer.

2. The method of claim 1 wherein vacuum-absorbing comprises drawing a vacuum on a fluid path formed through a supporter of the polishing head on which the membrane is mounted.

3. The method of claim 2 wherein the vacuum hole of the membrane comprises multiple first vacuum holes and wherein the supporter includes multiple second vacuum holes in alignment with the multiple first vacuum holes, and wherein the fluid path is in communication with the multiple second vacuum holes.

4. The method of claim 3 wherein, during vacuum absorbing, each of the first vacuum holes forms a seal about the corresponding second vacuum hole.

5. The method of claim 3 wherein a plurality of film structures are disposed on an outer surface of the supporter about each of the multiple second holes, each of the films mating with the corresponding first vacuum hole formed in the membrane.

6. The method of claim 1 wherein polishing the wafer is performed by applying pressure to a region between the membrane and the polishing head through the vacuum hole to place the wafer in contact with the polishing head.

7. The method of claim 1 wherein polishing the wafer comprises expanding the membrane to provide a uniform load over the wafer.

8. The method of claim 1 further comprising chucking the wafer, wherein the wafer is vacuum-absorbed through the vacuum hole and the wafer is adhered to the membrane.

9. The method of claim 8 further comprising an unloading the wafer, wherein pressure is applied to the membrane to release the wafer from the membrane.

10. A method for polishing a wafer, comprising the steps of:

vacuum-absorbing a wafer through a vacuum hole of a membrane positioned under a polishing head, wherein vacuum-absorbing comprises drawing a vacuum on a fluid path formed through a supporter of the polishing head on which the membrane is mounted, wherein the vacuum hole of the membrane comprises multiple first vacuum holes and wherein the supporter includes multiple second vacuum holes in alignment with the multiple first vacuum holes, and wherein the fluid path is in communication with the multiple second vacuum holes, and wherein a plurality of film structures are disposed on an outer surface of the supporter about each of the multiple second holes, each of the films mating with the corresponding first vacuum hole formed in the membrane;

locating the vacuum-absorbed wafer on a polishing pad; and polishing the wafer.

* * * * *